United States Patent
Tamura

(10) Patent No.: US 8,952,313 B2
(45) Date of Patent: Feb. 10, 2015

(54) SEMICONDUCTOR DEVICE HAVING DIRECT CONNECTING STRUCTURE INCLUDING FIRST DETECTOR, SECOND DETECTOR, FIRST TRANSISTOR, AND SECOND TRANSISTOR ELEMENTS

(75) Inventor: Hikaru Tamura, Zama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 257 days.

(21) Appl. No.: 13/543,146

(22) Filed: Jul. 6, 2012

(65) Prior Publication Data

US 2013/0015326 A1 Jan. 17, 2013

(30) Foreign Application Priority Data

Jul. 15, 2011 (JP) .................................. 2011-156679

(51) Int. Cl.
  *H01L 27/00* (2006.01)
  *H01J 40/14* (2006.01)
  *H01L 27/146* (2006.01)

(52) U.S. Cl.
  CPC .... *H01L 27/14612* (2013.01); *H01L 27/14641* (2013.01); *H01L 27/14621* (2013.01); *H01L 27/14627* (2013.01)
  USPC .................................... 250/208.1; 250/214 R

(58) Field of Classification Search
  CPC ............ H01L 27/146; H01L 27/14641; H01L 27/14612; H01L 27/14621; H01L 27/14627
  USPC ..... 250/208.1, 214 R, 214.1, 214 A, 214 LA, 250/214 LS, 214 SW; 348/300–302, 308, 348/309, 314; 257/290–292, 431; 327/204, 327/207, 493, 514, 515
  See application file for complete search history.

(56) References Cited

U.S. PATENT DOCUMENTS 5,386,108 A * 1/1995 Arikawa et al. ............ 250/208.1
5,955,753 A   9/1999 Takahashi
(Continued)

FOREIGN PATENT DOCUMENTS

EP    0757476 A    2/1997
JP    09-046596 A  2/1997
(Continued)

OTHER PUBLICATIONS

International Search Report (Application No. PCT/JP2012/067243) Dated Aug. 7, 2012.
(Continued)

*Primary Examiner* — Georgia Y Epps
*Assistant Examiner* — Don Williams
(74) *Attorney, Agent, or Firm* — Eric J. Robinson; Robinson Intellectual Property Law Office, P.C.

(57) ABSTRACT

The semiconductor device includes a plurality of pixels arranged in rows and columns, and first transistors fewer than the number of the plurality of pixels. The plurality of pixels each includes a photodiode and an amplifier circuit. The amplifier circuit holds the accumulated charge and includes at least a second transistor electrically connected to a cathode of the photodiode. The cathode of the photodiode in the pixel in an n-th row and the cathode of the photodiode in the pixel in an (n+1)-th row are electrically connected to the first transistor. The number n is a natural number. The pixel in the n-th row and the pixel in the (n+1)-th row are in an identical column.

13 Claims, 12 Drawing Sheets

(56) References Cited

U.S. PATENT DOCUMENTS

| | | | |
|---|---|---|---|
| 6,747,638 | B2 | 6/2004 | Yamazaki et al. |
| 8,547,753 | B2 * | 10/2013 | Takemura et al. ....... 365/185.23 |
| 2004/0042707 | A1 | 3/2004 | Imai et al. |
| 2008/0054319 | A1 | 3/2008 | Mouli |
| 2009/0101948 | A1 | 4/2009 | Park et al. |
| 2010/0182282 | A1 | 7/2010 | Kurokawa et al. |
| 2011/0108836 | A1 | 5/2011 | Koyama et al. |
| 2011/0204371 | A1 | 8/2011 | Kozuma et al. |

FOREIGN PATENT DOCUMENTS

| | | |
|---|---|---|
| JP | 2009-141717 A | 6/2009 |
| JP | 2011-119711 A | 6/2011 |
| WO | WO-2011/055626 | 5/2011 |

OTHER PUBLICATIONS

Written Opinion (Application No. PCT/JP2012/067243) Dated Aug. 7, 2012.

* cited by examiner

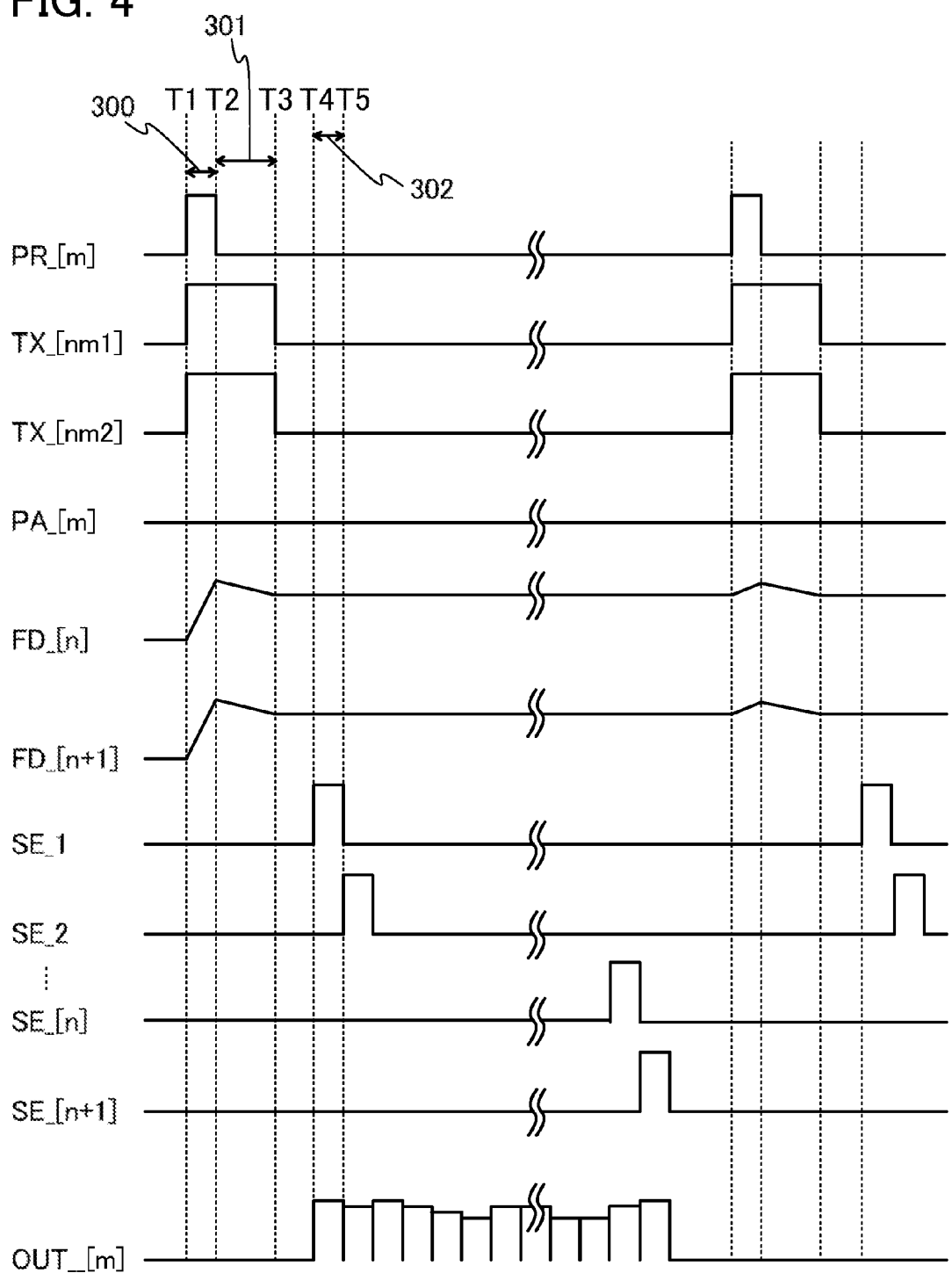

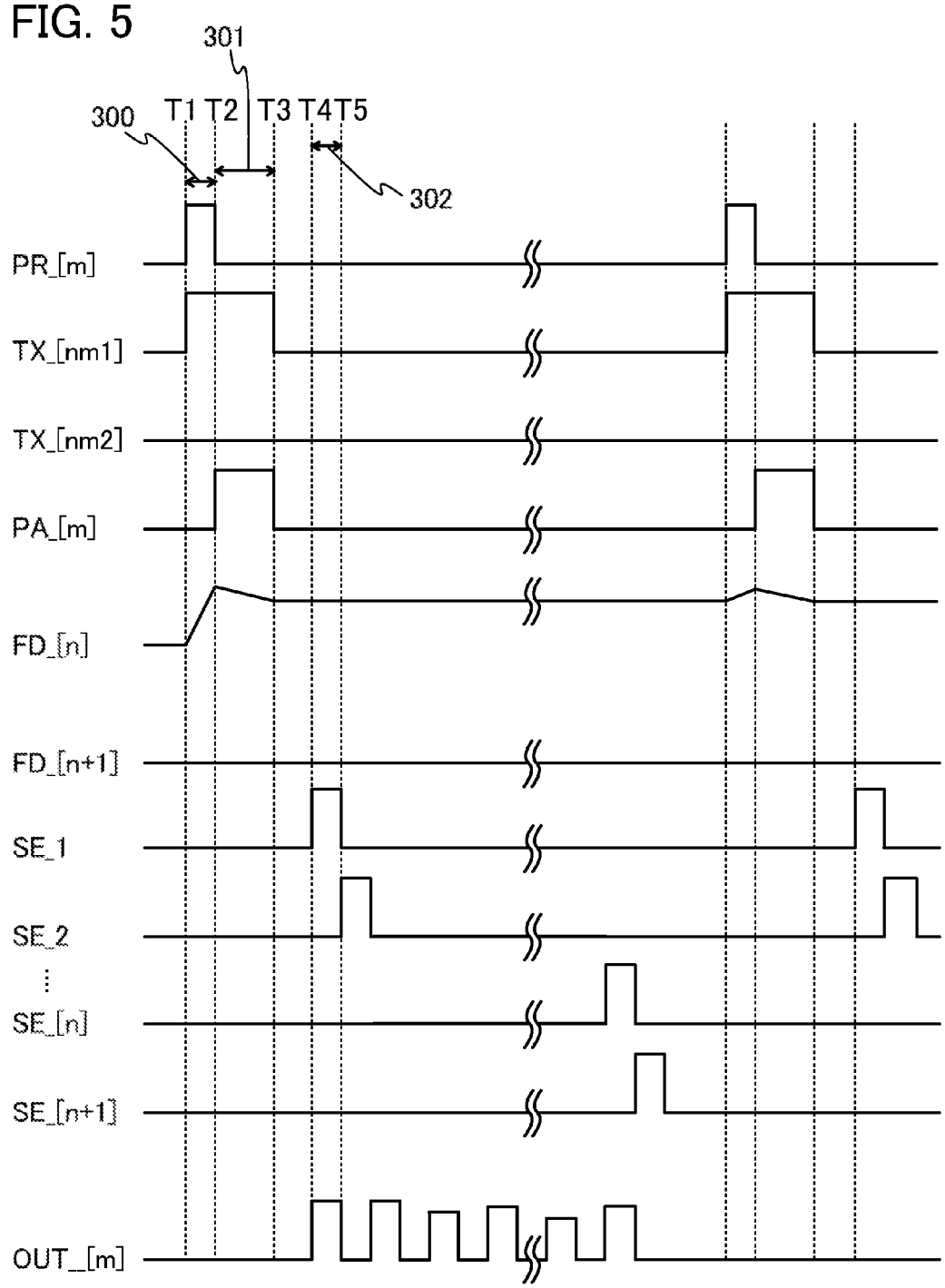

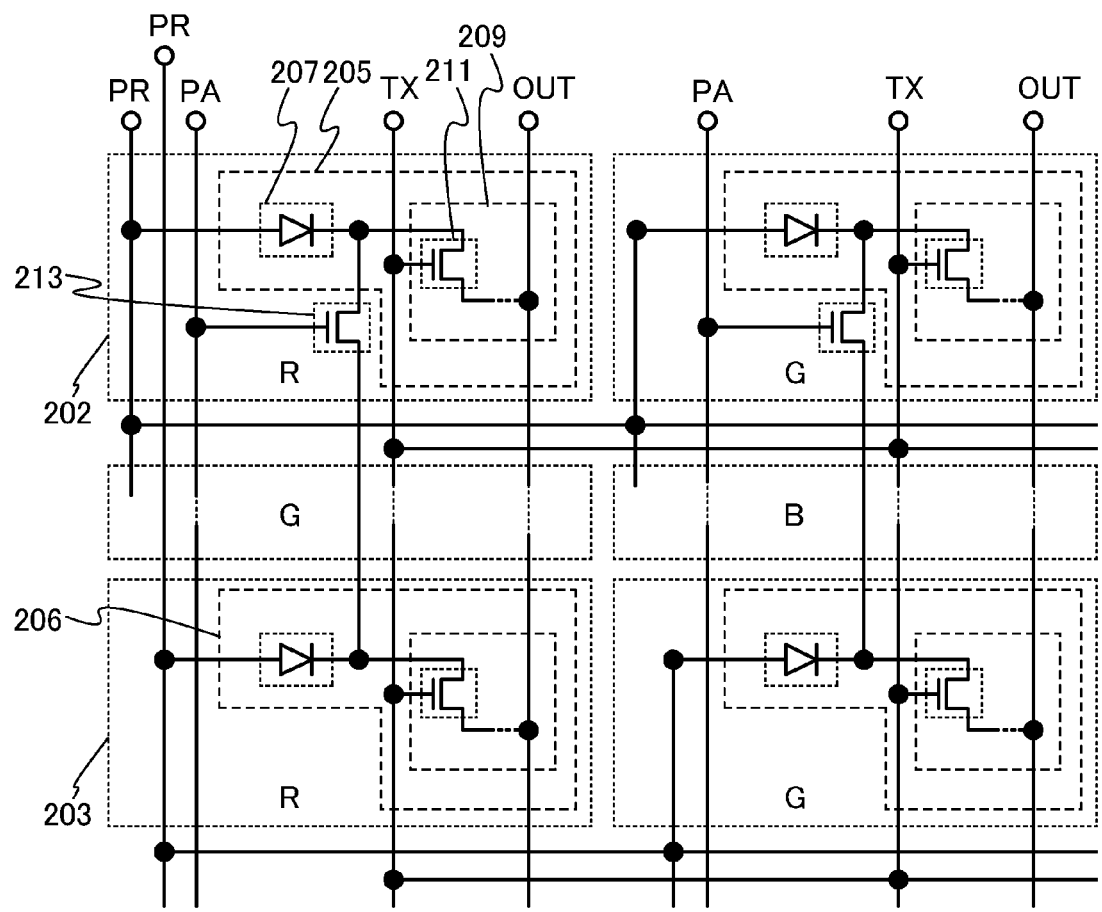

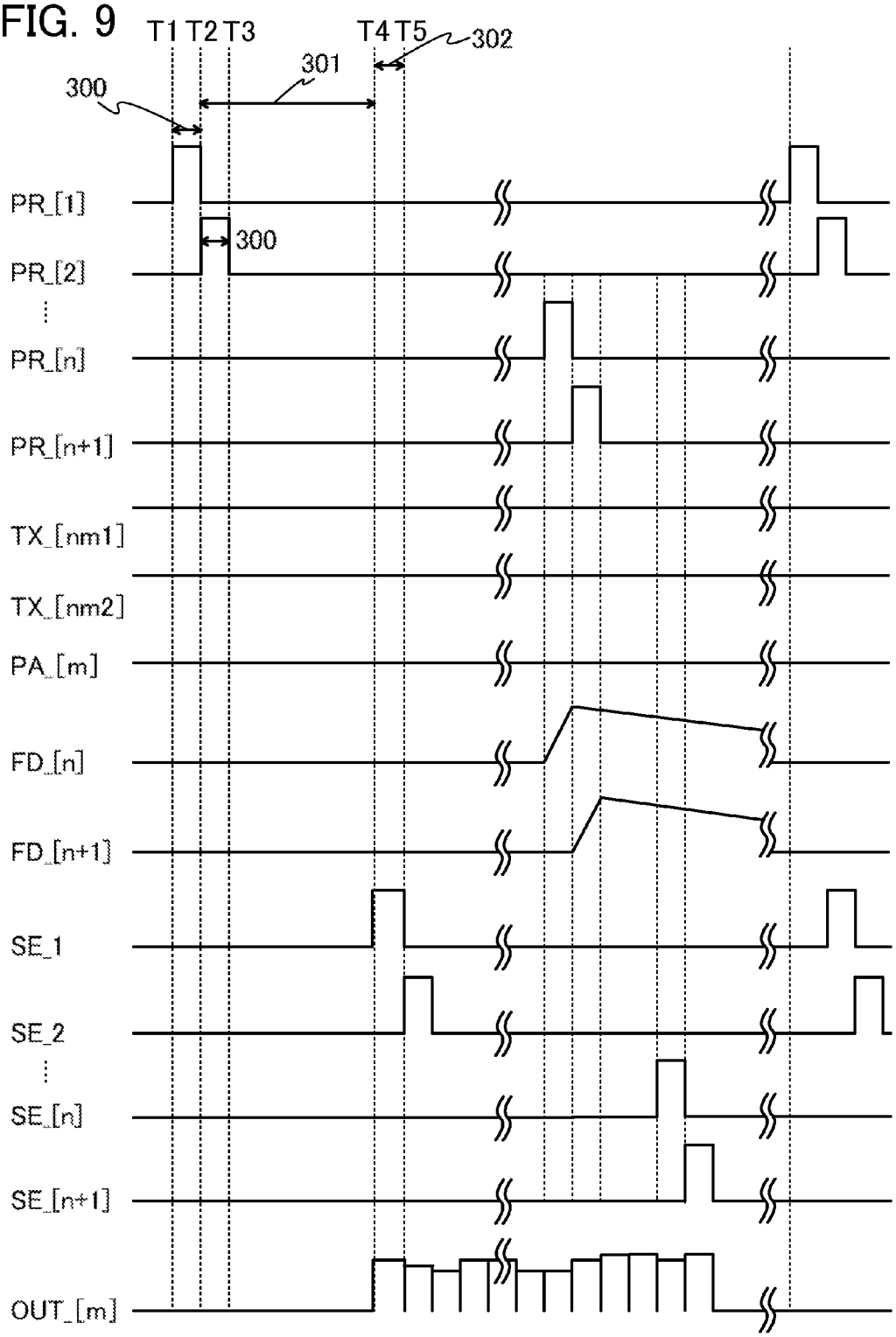

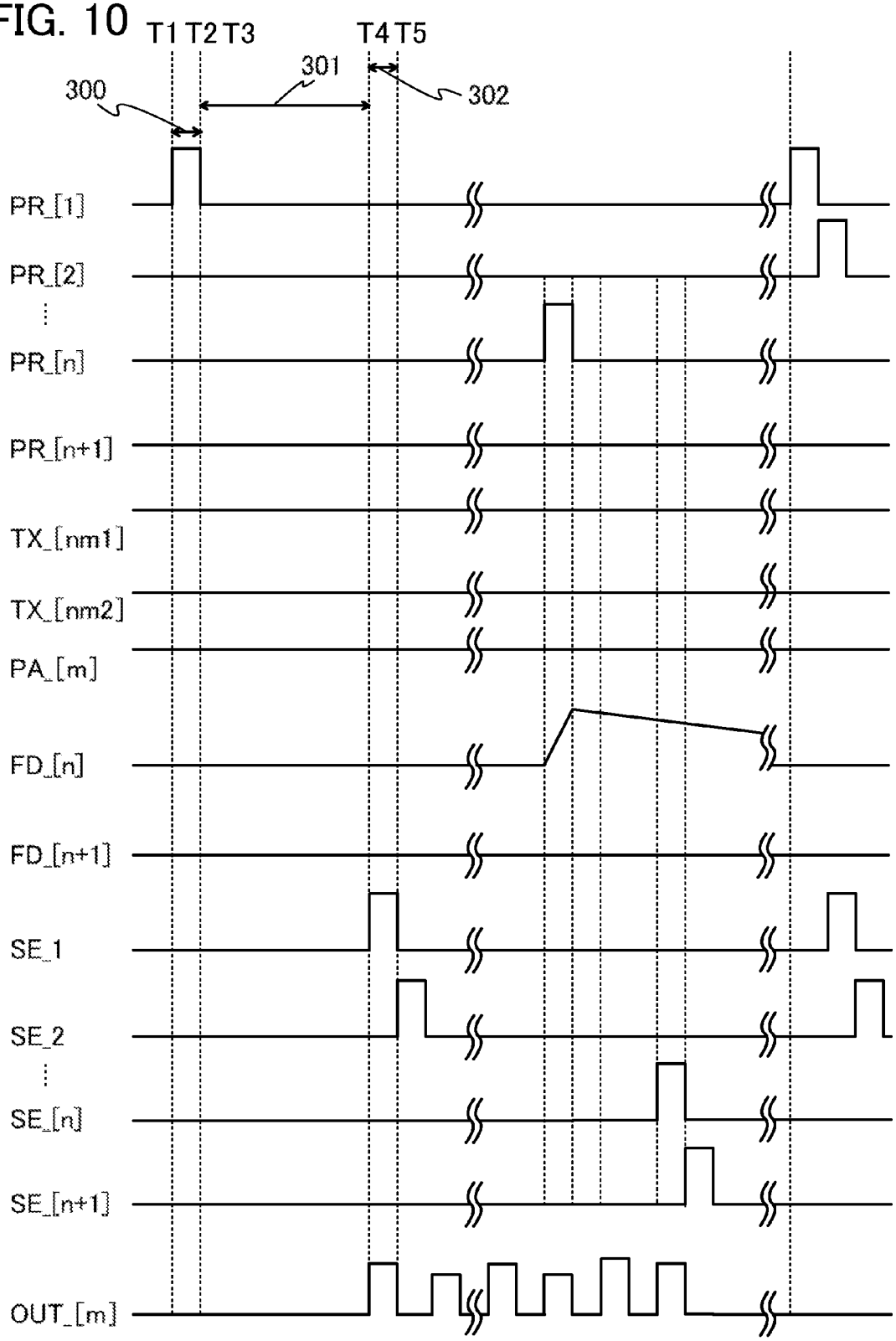

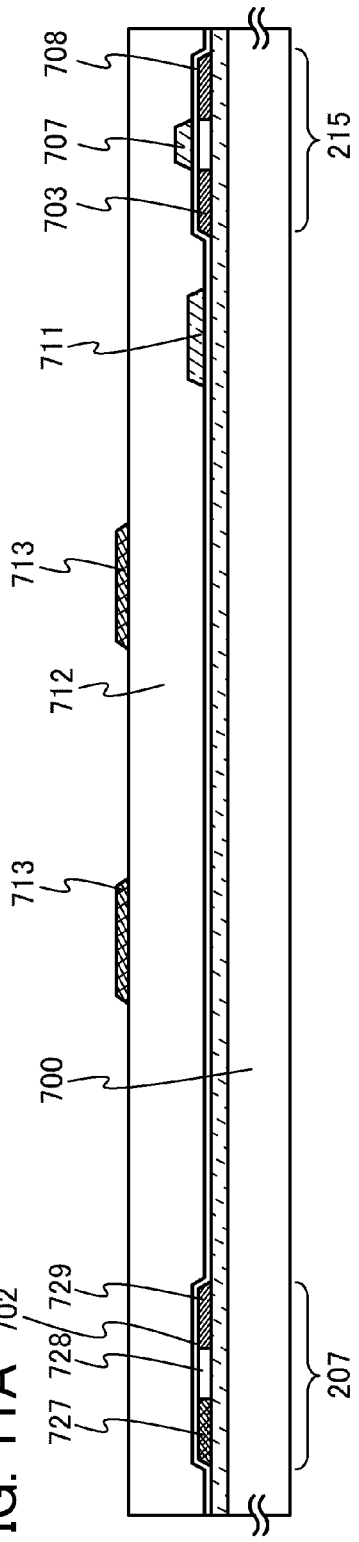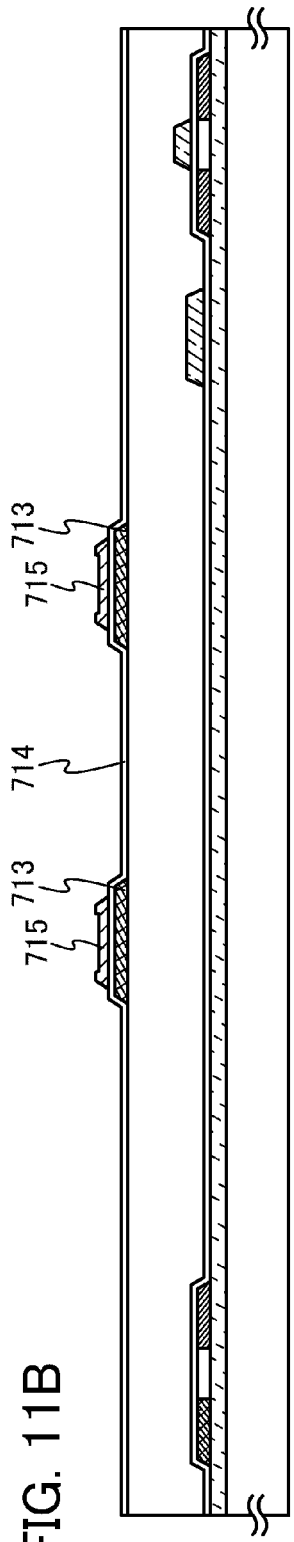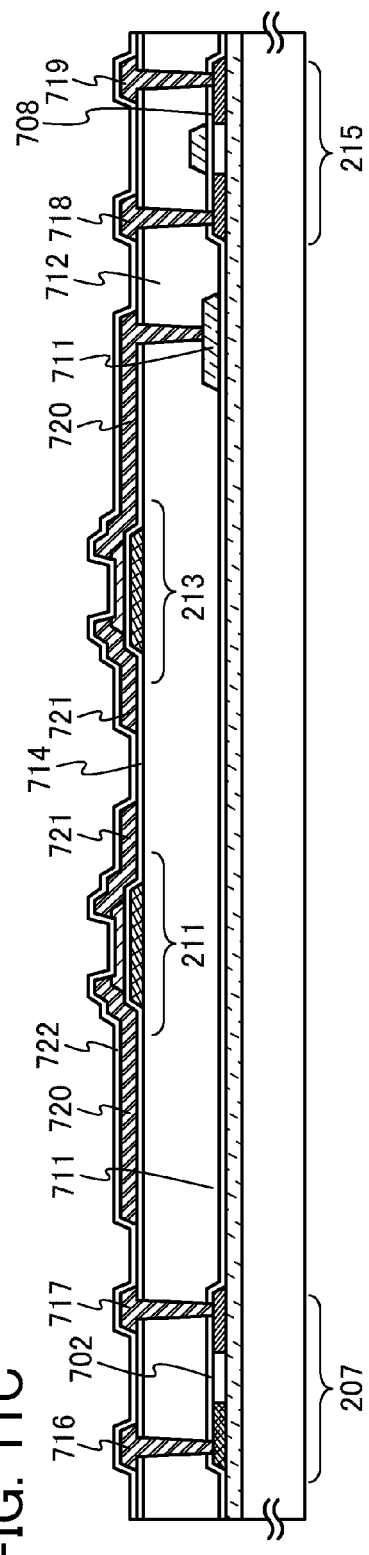

SEMICONDUCTOR DEVICE HAVING DIRECT CONNECTING STRUCTURE INCLUDING FIRST DETECTOR, SECOND DETECTOR, FIRST TRANSISTOR, AND SECOND TRANSISTOR ELEMENTS

TECHNICAL FIELD

The present invention relates to a semiconductor device and a method for driving the semiconductor device. Specifically, the present invention relates to a solid-state imaging device including a plurality of pixels provided with photosensors and to a method for driving the solid-state imaging device. Further, the present invention relates to an electronic device including the solid-state imaging device.

Note that a semiconductor device refers to a semiconductor element itself or a device including a semiconductor element. Examples of semiconductor elements include thin film transistors. Therefore, semiconductor devices include display devices and memory devices.

BACKGROUND ART

A photosensor utilizing an amplifying function of a MOS transistor, called a CMOS sensor, can be manufactured by a general CMOS process. Thus, manufacturing cost of a solid-state imaging device including a CMOS sensor in each pixel can be low, and a semiconductor device having a photosensor and a display element formed over one substrate can be realized. In addition, a CMOS sensor requires lower driving voltage than a CCD sensor; therefore, power consumption of the solid-state imaging device can be suppressed.

A solid-state imaging device including a CMOS sensor generally employs, for imaging, a rolling shutter method in which an operation to accumulate charge in a photodiode and an operation to read the charge are sequentially performed row by row (see Patent Document 1). In some cases, such a solid-state imaging device employs a global shutter method in which all the pixels are subjected to an operation to accumulate charge at a time, instead of the rolling shutter method.

REFERENCE

Patent Document

[Patent Document 1] Japanese Published Patent Application No. 2009-141717

DISCLOSURE OF INVENTION

When using either the rolling shutter method or global shutter method, a solid-state imaging device including a CMOS sensor requires improved dynamic range to perform imaging in various environments.

For example, in imaging under an environment where the illuminance of external light is low (during the night or in a dark room), light entering a photodiode is weak (the amount of the light is small); therefore, exposure time needs to be extended. Moreover, during the exposure time, data of a distorted image of an object is generated when the object moves or the solid-state imaging device is moved. Thus, extended exposure time may lead to generation of data of a distorted image of the object.

As the size of the solid-state imaging device is reduced, a region of the photodiode which is irradiated with light is reduced, which further precludes imaging under an environment where the illuminance of external light is low.

Low power consumption is one of the important measures for evaluation of the performance of a solid-state imaging device. In particular, in a portable electronic device such as a mobile phone, high power consumption of a solid-state imaging device leads to a disadvantage of short continuous operation time.

It is an object of one embodiment of the present invention to provide a solid-state imaging device that enables improvement in dynamic range. It is another object of one embodiment of the present invention to provide a solid-state imaging device that enables improvement in the quality of an image. It is another object of one embodiment of the present invention to provide a low-power-consumption solid-state imaging device.

In view of the above problems, one embodiment of the present invention is a semiconductor device including a plurality of pixels arranged in rows and columns, and first transistors fewer than the number of the plurality of pixels. The plurality of pixels each includes a photodiode passing current having a value determined by an intensity of light entering the photodiode, and an amplifier circuit accumulating charge with an amount determined by the value of the current and generating an output signal containing the amount of the charge as data. The amplifier circuit holds the accumulated charge and includes at least a second transistor electrically connected to a cathode of the photodiode. The cathode of the photodiode in the pixel in an n-th row and the cathode of the photodiode in the pixel in an (n+1)-th row are electrically connected to the first transistor. The number n is a natural number. The pixel in the n-th row and the pixel in the (n+1)-th row are in an identical column.

One embodiment of the present invention is a semiconductor device including a plurality of pixels arranged in rows and columns, and first transistors fewer than the number of the plurality of pixels. The plurality of pixels each includes at least red, blue, and green sub-pixels each including a photodiode passing current having a value determined by an intensity of light entering the photodiode, and an amplifier circuit accumulating charge with an amount determined by the value of the current and generating an output signal containing the amount of the charge as data. The amplifier circuit holds the charge accumulated and includes at least a second transistor electrically connected to a cathode of the photodiode. The cathode of the photodiode in the sub-pixel in an n-th row and the cathode of the photodiode in the sub-pixel that is provided in an (n+1)-th row and is of a color identical with that of the sub-pixel in the n-th row are electrically connected to the first transistor. The number n is a natural number. The sub-pixel in the n-th row and the sub-pixel in the (n+1)-th row are in an identical column.

In the above semiconductor devices, the off-state current density of the first transistor and the off-state current density of the second transistor are 10 aA/$\mu$m or less, preferably 100 yA/$\mu$m or less. In the solid-state imaging device according to one embodiment of the present invention, a pixel in a pixel group provided in the n-th row and one column is connected to a pixel in a pixel group provided in the (n+1)-th row and that column by the first transistor. Therefore, by using a transistor with extremely low off-state current density as the first transistor, mixture of charge accumulated by imaging performed with a pixel group provided in the n-th row and charge accumulated during imaging performed with a pixel group provided in the (n+1)-th row can be suppressed. Moreover, by using a transistor with extremely low off-state current density as the second transistor and using the second transistor as a switching element for holding charge accumulated by imaging, variations in grayscale level due to variations in the length of the charge holding period can be maintained at a low level. Thus, the quality of data of an image of the object can be improved.

A transistor can achieve extremely low off-state current density when including, in a channel formation region, a semiconductor material whose band gap is wider than that of silicon and whose intrinsic carrier density is lower than that of silicon. An example of such a semiconductor material is an oxide semiconductor. In this specification, an oxide semiconductor is a metal oxide having semiconductor properties.

By using transistors including an oxide semiconductor in their channel formation regions as transistors included in the solid-state imaging device, the leakage current of each transistor, drive voltage, and the power consumption of the solid-state imaging device can be reduced.

The solid-state imaging device can employ the rolling shutter method and the global shutter method. In the solid-state imaging device, the on state and the off state of the first transistor are selected in accordance with the luminance of external light, and electrical continuity can be established between photodiodes in pixels sharing a wiring to which an output signal is supplied, or photodiodes in sub-pixels of the same color sharing a wiring to which an output signal is supplied. For example, during imaging under an environment where the illuminance of external light is low, the first transistor in the solid-state imaging device is turned on to establish electrical continuity between photodiodes in pixels (or sub-pixels of the same color) sharing a wiring to which an output signal is supplied. Thus, a region of the photodiode which light enters during the imaging, the amount of charge accumulated, and the potential of an output signal corresponding to the amount of charge can be increased. Consequently, during imaging under an environment where the illuminance of external light is low, data of an image with less distortion can be obtained without extending the exposure time. In other words, the dynamic range of the solid-state imaging device can be improved.

According to one embodiment of the present invention, a solid-state imaging device with improved dynamic range, a solid-state imaging device that enables improvement in the quality of an image, and a low-power-consumption solid-state imaging device can be provided.

BRIEF DESCRIPTION OF DRAWINGS

FIG. 4 is a timing chart of a photosensor.

FIG. 5 is a timing chart of a photosensor.

FIG. 7 is a circuit diagram of a pixel portion.

FIG. 9 is a timing chart of a photosensor.

FIG. 10 is a timing chart of a photosensor.

FIGS. 11A to 11C are cross-sectional views illustrating a method for manufacturing a photodiode and transistors included in a photosensor.

BEST MODE FOR CARRYING OUT THE INVENTION

Embodiments of the present invention will be described below in detail with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

In this specification, "connection" means electrical connection and corresponds to the state in which current, voltage, or potential can be supplied or transmitted. Therefore, a state of connection means not only a state of direct connection but also a state of indirect connection through a circuit element such as a wiring, a resistor, a diode, or a transistor, in which current, voltage, or potential can be supplied or transmitted.

Embodiment 1

A description is given with reference to drawings of a structure of a solid-state imaging device according to one embodiment of the present invention, a structure of photosensors included in the solid-state imaging device, and connections between the photosensors. Note that this embodiment describes the case where the global shutter method is used.

Figure 1A:
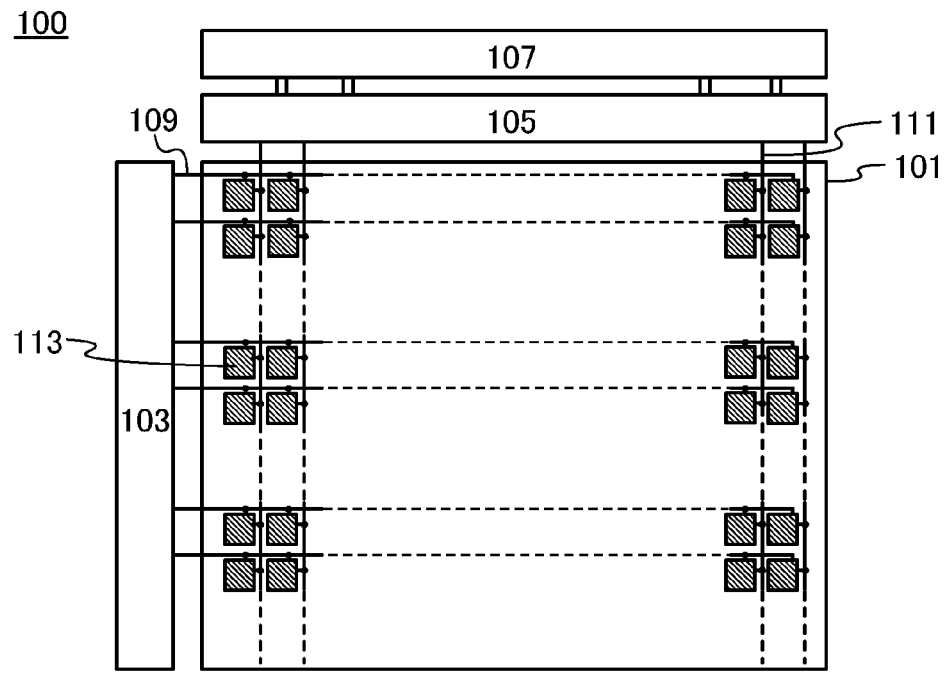
FIGS. 1A and 1B are diagrams illustrating a structure of a solid-state imaging device according to one embodiment of the present invention.

FIG. 1A illustrates an example of a structure of a solid-state imaging device 100 according to one embodiment of the present invention. The solid-state imaging device 100 includes at least a pixel portion 101, a horizontal selection circuit 103, a data output circuit 105, a data processing circuit 107, a plurality of selection lines 109 which are arranged in parallel or substantially parallel to one another and which are connected to the horizontal selection circuit 103 so that the potentials of the selection lines 109 are controlled, and a plurality of output lines 111 which are arranged in parallel or substantially parallel to one another and which are connected to the data output circuit 105 so that the potentials of output signals are supplied to the output lines 111. Note that the solid-state imaging device 100 may include another wiring in addition to the selection lines 109 and the output lines 111 illustrated in FIG. 1A.

Pixels 113 are arranged in a matrix in the pixel portion 101. Each selection line 109 is connected to a plurality of pixels 113 provided in one row. Each output line 111 is connected to a plurality of pixels 113 provided in one column.

The horizontal selection circuit 103, the data output circuit 105, and the data processing circuit 107 includes at least a logic circuit and a switch, or at least the logic circuit and a buffer. The data output circuit 105 performs amplification, conversion, and the like of an output signal supplied to the output line 111 and sends the amplified and converted signal to the data processing circuit 107. The data processing circuit 107 controls the horizontal selection circuit 103, controls exposure time, and obtains (or generates) image data by processing the output signal, for example.

The horizontal selection circuit 103, the data output circuit 105, and the data processing circuit 107 may be formed over the same substrate as the pixel portion 101. Alternatively, the horizontal selection circuit 103, the data output circuit 105, and the data processing circuit 107 may be partly or fully implemented in a semiconductor device such as an IC.

Figure 1B:
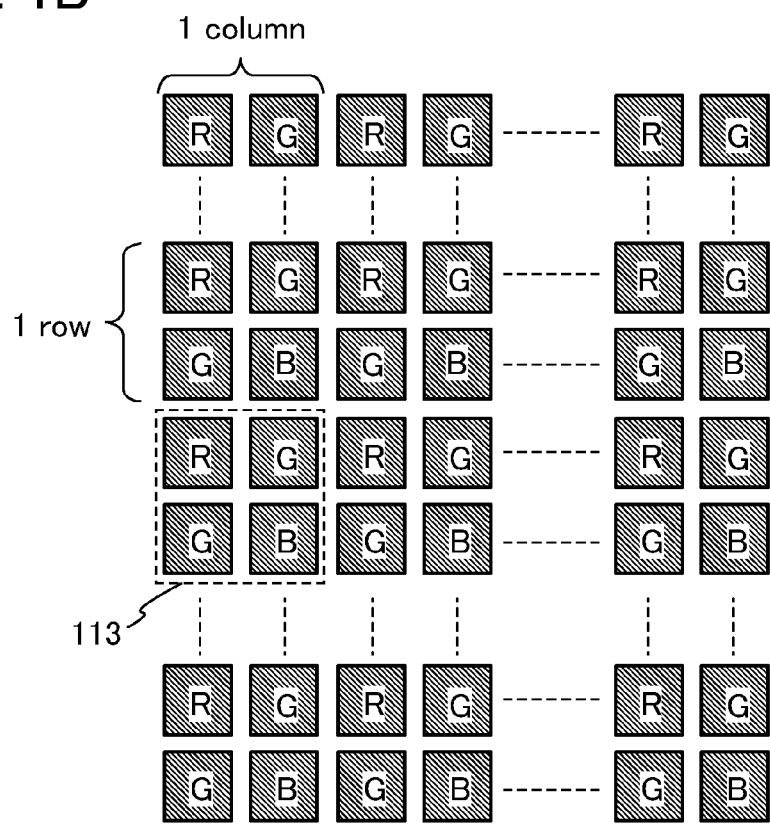

FIG. 1B is an enlarged view of the pixel portion 101. FIG. 1B does not illustrate the selection lines 109 and the output lines 111 for simplicity. In the solid-state imaging device 100, the pixel 113 may include sub-pixels provided with red (R), green (G), and blue (B) color filters for color imaging. Note that, in FIG. 1B, the pixel 113 includes four sub-pixels: one red sub-pixel, one blue sub-pixel, and two green sub-pixels, but its composition is not limited to this. Here, a row pixel group and a column pixel group in which a pixel 113 including four sub-pixels is considered as one pixel are formed. Note that the selection line 109 and the output line 111 are branched so as to be connected to the sub-pixels in the pixel 113.

In addition, the solid-state imaging device 100 is not necessarily provided with the sub-pixels illustrated in FIG. 1B when being designed to display black-and-white images.

Figure 2A:
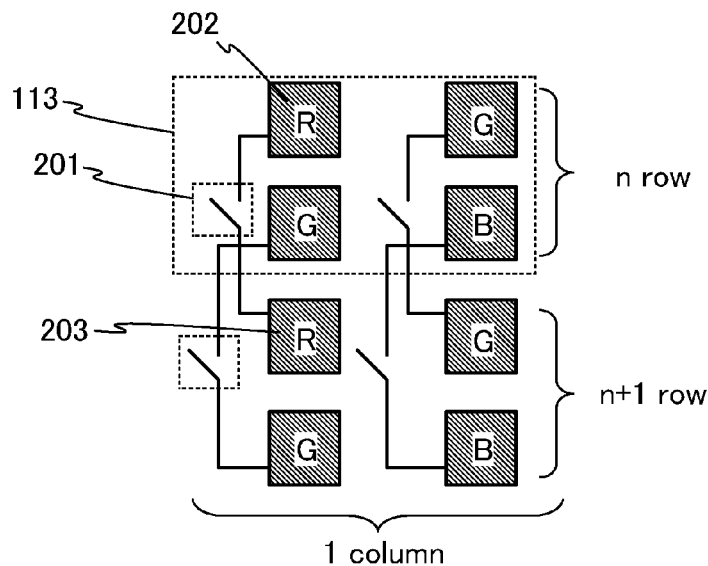
FIGS. 2A and 2B are circuit diagrams of a pixel portion.

FIG. 2A is an example of a circuit diagram of the pixel portion 101. The RGB sub-pixels included in each pixel 113 are provided with photosensors. In a pixel group in an n-th row (n is a natural number) and a pixel group in an (n+1)-th row, the photosensors provided in sub-pixels which are in the same column and of the same color are connected to each other through a switching element 201. Note that "a pixel group in an n-th row" can also be called "pixels in an n-th row", and "a pixel group in an (n+1)-th row" can also be called "pixels in an (n+1)-th row".

Specifically, the photosensor in an R sub-pixel 202 of the pixel 113 in the n-th row is connected to the photosensor in an R sub-pixel 203 of the pixel 113 in the (n+1)-th row with the switching element 201. The photosensors in the B sub-pixels of the pixel 113 in the n-th row and the pixel 113 in the (n+1)-th row are connected to each other with the switching element 201. The photosensors in the G sub-pixels of the pixel 113 in the n-th row and the pixel 113 in the (n+1)-th row are connected to each other with the switching element 201. A transistor can be used as the switching element 201.

Figure 2B:
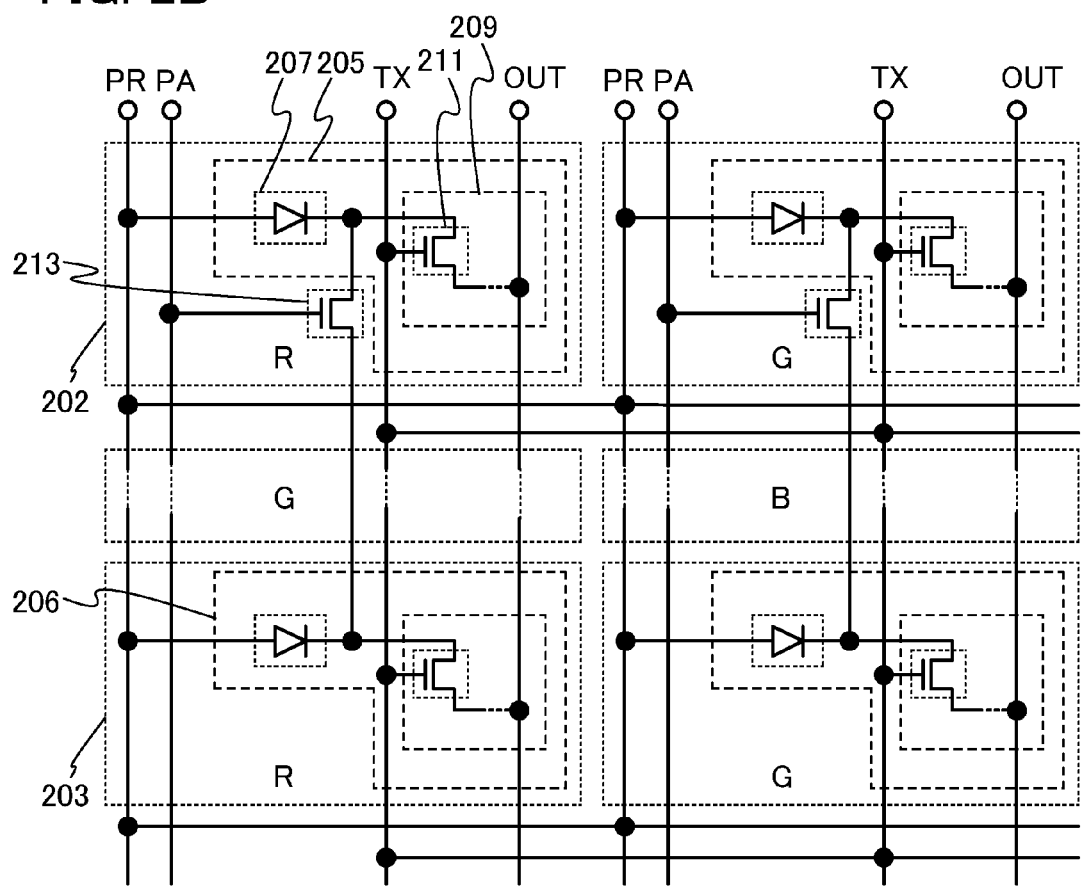

FIG. 2B is an example of a circuit diagram illustrating connections between the photosensors included in the pixels 113. Here, a description is given taking a connection between the R sub-pixel 202 and the R sub-pixel 203 as an example. The photosensors included in the R sub-pixel 202 and the R sub-pixel 203 (in FIG. 2B, a photosensor 205 and a photosensor 206) each include a photodiode 207 and an amplifier circuit 209. The photodiode 207 is a photoelectric conversion element which generates current when a junction of semiconductors is irradiated with light. The amplifier circuit 209 is a circuit which amplifies current obtained through light reception by the photodiode 207 or which holds charge accumulated due to the current. Since each pixel includes a photosensor and a photodiode, "pixel" can also be called "photosensor" or "photodiode" as appropriate in this specification.

The amplifier circuit 209 may have any configuration as long as it can amplify current generated in the photodiode 207; the amplifier circuit 209 includes at least a transistor 211 which functions as a switching element. The switching element controls the supply of the current to the amplifier circuit 209.

By switching between the on and off states of a transistor 213 serving as the switching element 201 with which the photosensor 205 and the photosensor 206 are connected to each other, whether electrical continuity between the photodiode 207 in the photosensor 205 and the photodiode 207 in the photosensor 206 is established can be selected. For example, during imaging under an environment where the illuminance of external light is low, electrical continuity between the photodiode 207 in the photosensor 205 and the photodiode 207 in the photosensor 206 is established by turning on the transistor 213. By establishing electrical continuity between the photodiode 207 in the photosensor 205 and the photodiode 207 in the photosensor 206, the photodiode 207 in the photosensor 205 and the photodiode 207 in the photosensor 206 are connected in parallel.

In one embodiment of the present invention, a channel formation region of the transistors 211 and 213 may include a semiconductor material whose band gap is wider than that of a silicon semiconductor and whose intrinsic carrier density is lower than that of silicon. As examples of the semiconductor material, a compound semiconductor such as silicon carbide (SiC) or gallium nitride (GaN), an oxide semiconductor including a metal oxide such as zinc oxide (ZnO), and the like can be given. Among the above semiconductors, an oxide semiconductor has an advantage such as high mass productivity because an oxide semiconductor can be formed by a sputtering method, a wet process (e.g., a printing method), or the like. A compound semiconductor such as silicon carbide or gallium nitride is required to be a single crystal, and in order to obtain a single crystal material, crystal growth at a temperature significantly higher than a process temperature for the oxide semiconductor is needed or epitaxial growth over a special substrate is needed. On the other hand, an oxide semiconductor has high mass productivity because a film thereof can be formed even at room temperature and therefore the film can be formed over a silicon wafer that can be obtained easily or a glass substrate which is inexpensive and can be applied when the size of a substrate is increased. In addition, it is possible to stack a semiconductor element including an oxide semiconductor over an integrated circuit including a normal semiconductor material such as silicon or gallium. Further, in the case where a crystalline oxide semiconductor is to be obtained in order to improve the performance of a transistor (e.g., field-effect mobility or reliability), the crystalline oxide semiconductor can be easily obtained by heat treatment at 200° C. to 800° C.

In the following description, the case in which an oxide semiconductor having the above advantages is used as the semiconductor having a wide band gap is given as an example.

When a semiconductor material having the above-described characteristics is included in a channel formation region, the transistors 211 and 213 can have extremely small off-state current density and high withstand voltage. Further, when the transistors 211 and 213 having the above-described structure are used as switching elements, leakage of charge accumulated in the amplifier circuit 209 can be prevented. Moreover, mixture of charge accumulated in the amplifier circuit 209 in the photosensor 205 in the n-th row and charge accumulated in the amplifier circuit 209 in the photosensor 206 in the (n+1)-th row can be prevented.

Note that it is preferable to use a semiconductor with a wide band gap such as an oxide semiconductor for active layers of the transistors 211 and 213, but the present invention is not necessarily limited to this structure. It is possible to operate the solid-state imaging device 100 by a global shutter method even when a semiconductor other than an oxide semiconductor, such as amorphous silicon, microcrystalline silicon, polycrystalline silicon, single crystal silicon, amorphous germanium, microcrystalline germanium, polycrystalline germanium, or single crystal germanium, is used for the active layers of the transistors 211 and 213.

Unless otherwise specified, in the case of an n-channel transistor, off-state current in this specification is a current which flows between a source electrode and a drain electrode when, in the state where the potential of the drain electrode is higher than that of the source electrode and that of a gate electrode, the potential of the gate electrode is less than or equal to 0 V with respect to the potential of the source electrode. Furthermore, in this specification, in the case of a p-channel transistor, off-state current is a current which flows between a source electrode and a drain electrode when, in the state where the potential of the drain electrode is lower than that of the source electrode or that of a gate electrode, the potential of the gate electrode is greater than or equal to 0 V with respect to the potential of the source electrode.

The names of the "source electrode" and the "drain electrode" included in the transistor interchange with each other depending on the polarity of the transistor or the levels of potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. One of a source electrode and a drain electrode is referred to as a first terminal and the other is referred to as a second terminal, and connections in the photosensors 205 and 206 and a connection among the photodiodes 207 of the photosensors 205 and 206 and the transistor 213 will be described below (see FIG. 2B). The configuration of and connections in the sub-pixels of the other colors are also as described below.

In the photosensor 205, an anode of the photodiode 207 is connected to a wiring PR. A cathode of the photodiode 207 is connected to a first terminal of the transistor 211. A second terminal of the transistor 211 is connected to another semiconductor element included in the amplifier circuit 209; thus, the connection of the second terminal of the transistor 211 differs depending on the configuration of the amplifier circuit 209. A gate electrode of the transistor 211 is connected to a wiring TX. The wiring TX is supplied with a potential of a signal for controlling the switching of the transistor 211. The photosensor 205 is connected to a wiring OUT. The wiring OUT is supplied with a potential of an output signal which is output from the amplifier circuit 209. Note that the wiring OUT corresponds to the output line 111 of the solid-state imaging device 100 (see FIG. 1A).

The structure and connections of the photosensor 206 are the same as those of the photosensor 205 described above.

A first terminal of the transistor 213 is connected to the cathode of the photodiode 207 in the photosensor 205. A second terminal of the transistor 213 is connected to a cathode of the photodiode 207 in the photosensor 206. A gate electrode of the transistor 213 is connected to a wiring PA. The wiring PA is supplied with the potential of a signal for controlling the switching of the transistor 213, in accordance with the luminance of external light.

Even when a circuit diagram illustrates independent components which are connected to each other, there is a case where one conductive film has functions of a plurality of components such as the case where part of a wiring functions as an electrode. In this specification, the term "connection" also means a case where one conductive film has functions of a plurality of components.

FIG. 2B illustrates as an example the case where the wiring PR, the wiring TX, and the wiring OUT are connected to each of the photosensors; however, the number of wirings included in each of the photosensors in one embodiment of the present invention is not limited to the number in this example. In addition to the above wirings, a wiring supplied with a power supply potential, a wiring supplied with a signal for resetting the amount of charge held by the amplifier circuit 209, or the like may be connected to each of the photosensors.

In one embodiment of the present invention, one wiring OUT is connected to the photosensors in the pixels in the same column or in the sub-pixels in the same column, and these photosensors are not connected to a wiring OUT (another wiring OUT) connected to the photosensors in the pixels in another column or in the sub-pixels in another column and are electrically isolated therefrom. In addition, in one embodiment of the present invention, a first photosensor group includes a plurality of photosensors connected to one wiring OUT; a second photosensor group includes a plurality of photosensors connected to another wiring OUT; and a wiring TX connected to the first photosensor group may be connected to a wiring TX connected to the second photosensor group (see FIG. 2B). In one embodiment of the present invention, a wiring PR connected to the first photosensor group may be connected to a wiring PR connected to the second photosensor group (see FIG. 2B). In one embodiment of the present invention, a wiring PA connected to the first photosensor group may be connected to a wiring PA connected to the second photosensor group (they are not connected to each other in FIG. 2B).

In one embodiment of the present invention, the above configuration can suppress a potential decrease or a signal delay due to the resistance of the wirings PR, TX or PA. As a result, it is possible to prevent a potential supplied to the anode of the photodiode 207, a potential of a signal for controlling the switching of the transistor 211, or a potential of a signal for controlling the switching of the transistor 213 from varying within the pixel portion 101. Accordingly, it is possible to prevent a potential of a signal to be output from the photosensors 205 and 206 from varying, and it is possible to improve the quality of an image.

Note that although FIG. 2B illustrates the configuration of the photosensors 205 and 206 in which the amplifier circuit 209 includes only one transistor 211 which functions as a switching element, the amplifier circuit 209 is not limited to this configuration. Although the configuration in which one transistor functions as one switching element is described, a plurality of transistors may function as one switching element in one embodiment of the present invention. In the case where a plurality of transistors functions as one switching element, the plurality of transistors may be connected to each other either in parallel, in series, or in parallel and series.

In this specification, the state in which transistors are connected to each other in series, for example, means a state in which only one of a first terminal and a second terminal of a first transistor is connected to only one of a first terminal and a second terminal of a second transistor. Further, the state in which transistors are connected to each other in parallel means a state in which a first terminal of a first transistor is connected to a first terminal of a second transistor and a second terminal of the first transistor is connected to a second terminal of the second transistor.

FIG. 2B illustrates the case where the transistors 211 and 213 each include the gate electrode only on one side of the active layer. When the transistors 211 and 213 each include a pair of gate electrodes having the active layer sandwiched therebetween, one of the gate electrodes is supplied with a signal for controlling switching, and the other of the gate electrodes may be in a floating state (i.e., electrically isolated) or may be supplied with a potential. In the latter case, the pair of electrodes may be supplied with the same level of potential, or only the other of the gate electrodes may be supplied with a fixed potential such as a ground potential. By controlling the level of potential supplied to the other of the gate electrodes, the threshold voltage of the transistors 211 and 213 can be controlled.

Figure 3A:
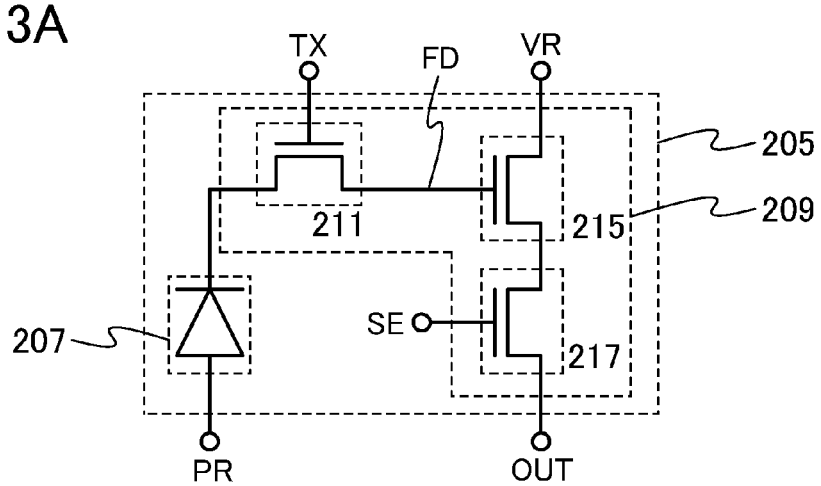
FIG. 3A is a circuit diagram of a photosensor.

Next, an example of a specific configuration of the photosensors 205 and 206 will be described. FIG. 3A is a circuit diagram of an example of the photosensors 205 and 206. Since the photosensor 206 has the same structure and connections as the photosensor 205, only the photosensor 205 is described here.

In the photosensor 205 illustrated in FIG. 3A, the amplifier circuit 209 includes a transistor 215 and a transistor 217 in addition to the transistor 211. In the transistor 215, the current value or resistance value between a first terminal and a second terminal thereof is determined by a potential supplied to the second terminal of the transistor 211. The transistor 217 functions as a switching element for supplying a potential of an output signal determined by the current value or resistance value, to the wiring OUT.

Specifically, in FIG. 3A, the second terminal of the transistor 211 is connected to a gate electrode of the transistor 215. The first terminal of the transistor 215 is connected to a wiring VR which is supplied with a high power supply potential (VDD) (also called high power supply potential line). The second terminal of the transistor 215 is connected to a first terminal of the transistor 217. A second terminal of the transistor 217 is connected to the wiring OUT. A gate electrode of the transistor 217 is connected to a wiring SE, and the wiring SE is supplied with a potential of a signal for controlling the switching of the transistor 217. Note that the wiring SE corresponds to the selection line 109 in the solid-state imaging device 100 (see FIG. 1A).

In FIG. 3A, a node where the second terminal of the transistor 211 and the gate electrode of the transistor 215 are connected to each other is denoted by a node FD. The current value or resistance value between the first terminal and the second terminal of the transistor 215 is determined by the amount of charge accumulated at the node FD. In addition to this, the potential of the output signal output from the second terminal of the transistor 217 is determined by a potential of a signal for controlling the switching of the transistor 217. In order to hold charge at the node FD more reliably, a storage capacitor may be connected to the node FD.

Figure 3B:
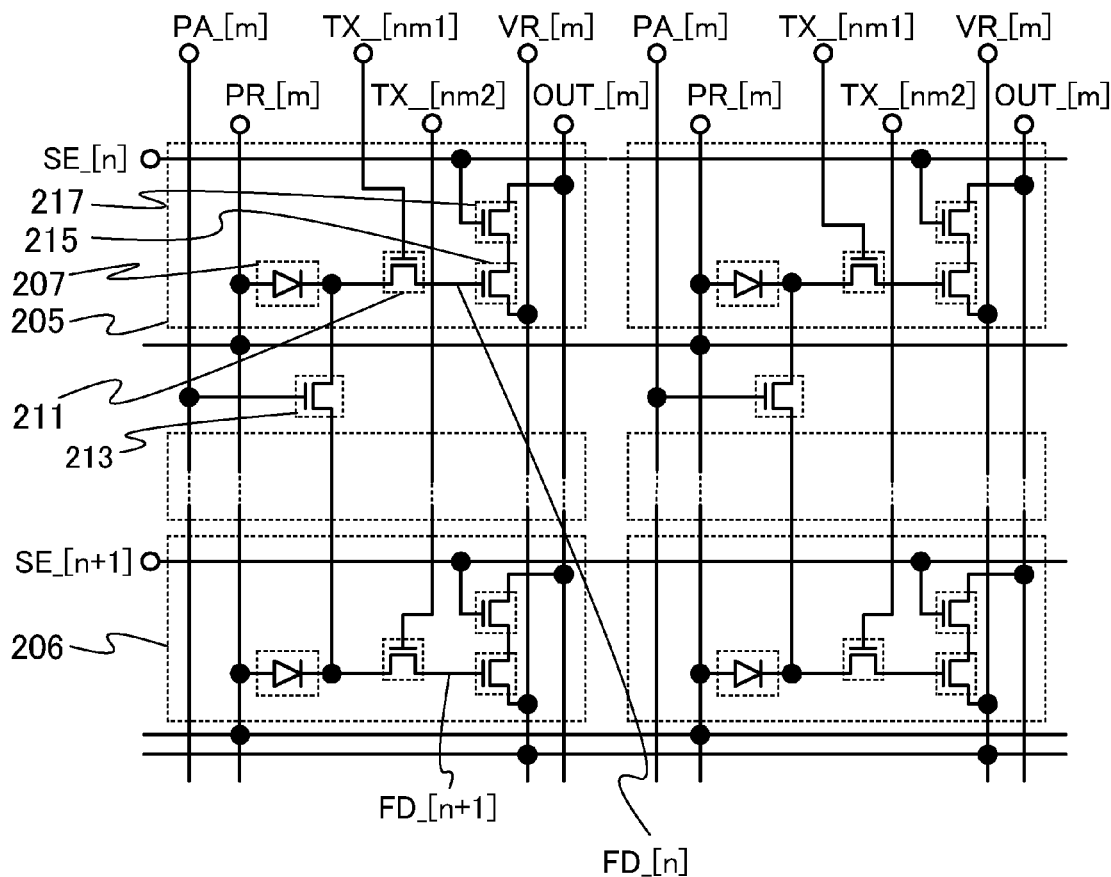
FIG. 3B is a circuit diagram of a pixel portion including the photosensor.

FIG. 3B is a circuit diagram showing the case where the photosensors 205 and 206 in FIG. 2B have the above-described structure.

The photosensor 205 in the n-th row is connected to a wiring SE_[n] among wirings SE. The photosensors 206 provided in the (n+1)-th row is connected to a wiring SE_[n+1]. Note that the wirings SE are independently provided for the respective rows.

The photosensors provided in the m-th column (m is a natural number) are connected to a wiring PR_[m] among wirings PR, to a wiring OUT_[m] among wirings OUT, and to a wiring VR_[m] among wirings VR. Note that the wirings PR are preferably independently provided for the respective columns. The wirings VR may also be independently provided for the respective columns. The wirings OUT are independently provided for the respective columns.

The photosensor 205 in the n-th row and the m-th column (n, m) is connected to a wiring TX_[nm1] among wirings TX. The photosensor 206 in the (n+1)-th row and the m-th column (n+1, m) is connected to a wiring TX_[nm2] among the wirings TX. Note that the wiring TX_[nm1] and the wiring TX_[nm2] are separately provided here, but the present invention is not limited to this; the wirings TX may be connected to each other as described above.

The cathode of the photodiode 207 of the photosensor 205 in the n-th row and the m-th column is connected to the first terminal of the transistor 213. The cathode of the photodiode 207 of the photosensor 206 in the (n+1)-th row and the m-th column is connected to the second terminal of the transistor 213. The gate electrode of the transistor 213 is connected to a wiring PA_[m] among wirings PA. Note that the wirings PA may be independently provided for the respective columns. Alternatively, the wirings PA may be connected to each other as described above.

In the above-described configuration, a plurality of photosensors 205 connected to the wiring OUT_[m] for the m-th column and to the wiring VR_[m] for the m-th column are not connected to the wirings OUT for columns other than the m-th column and to the wirings VR for columns other than the m-th column, and thus are electrically isolated from the photosensors in columns other than the m-th column (see FIG. 3B).

The above configuration can suppress a potential decrease or a signal delay due to the resistance of the wirings PR, TX or PA, as in the case shown in FIGS. 2A and 2B. As a result, it is possible to prevent a potential supplied to the anode of the photodiode 207, a potential of a signal for controlling the switching of the transistor 211, or a potential of a signal for controlling the switching of the transistor 213 from varying within the pixel portion 101. Accordingly, it is possible to prevent a potential of a signal to be output from the photosensors in the pixel portion 101 from varying, and it is possible to improve the quality of an image.

Note that in FIGS. 3A and 3B, oxide semiconductor films may be used for active layers of the transistors included in the amplifier circuit 209 except the transistors 211 and 213, that is, the transistors 215 and 217. When oxide semiconductor films are used for active layers of all of the transistors in the pixel portion 101, the manufacturing process can be simplified. Alternatively, a semiconductor other than an oxide semiconductor, such as amorphous silicon, microcrystalline silicon, polycrystalline silicon, single crystal silicon, amorphous germanium, microcrystalline germanium, polycrystalline germanium, or single crystal germanium, may be used for active layers of the transistors 215 and 217. When a semiconductor material providing higher mobility than an oxide semiconductor, such as polycrystalline or single crystal silicon is used for active layers of the transistors 215 and 217, image data can be read from the photosensors at high speed.

Next, a method for driving the pixel portion 101 is described. A description is given taking the pixels in the m-th column in the pixel portion 101 as an example. FIG. 4 is an example of a timing chart showing potentials applied to the wiring TX_[nm1], the wiring TX_[nm2], the wiring PA_[m], the wiring PR_[m], the wiring VR_[m], and the wiring OUT_[m]. FIG. 4 is also an example of a timing chart showing potentials applied to wirings SE_[1] to SE_[n+1] and potentials applied to a node FD_[n] and a node FD_[n+1] in the pixels in rows in the pixel portion 101.

Note that in the timing chart in this embodiment, for easy understanding of the driving method, it is assumed that the above-described wirings are supplied with a high-level potential and a low-level potential. Specifically, it is assumed that the wiring TX_[nm1] and the wiring TX_[nm2] are supplied with high-level potentials HTX_[nm1] and HTX_[nm2], respectively, and low-level potentials LTX_[nm1] and LTX_[nm2], respectively; the wirings SE_[1] to SE_[n+1] are supplied with high-level potentials HSE_[1] to HSE_[n+1], respectively, and low-level potentials LSE_[1] to LSE_[n+1], respectively; the wiring PA_[m] is supplied with a high-level potential HPA_[m] and a low-level potential LPA_[m]; the wiring PR_[m] is supplied with a high-level potential HPR_[m] and a low-level potential LPR_[m]; and the wiring OUT_[m] is supplied with a high-level potential HOUT_[m] and a low-level potential LOUT_[m]. Note that the wiring VR_[m] is assumed to be supplied with VDD, and thus is not shown in FIG. 4.

FIG. 4 is a timing chart showing the driving method in a condition where there is no electrical continuity between the photodiode 207 of the photosensor 205 in the n-th row and the photodiode 207 of the photosensor 206 in the (n+1)-th row, that is, a condition where the transistor 213 is in the off state. In the driving method, the wiring PA_[m] is always at a potential LPA_[m].

First, at a time T1, the potential of the wiring PR_[m] is changed from the potential LPR_[m] to the potential HPR_[m]. Further, at the time T1, the potential of the wiring TX_[nm1] is changed from the potential LTX_[nm1] to the potential HTX_[nm1], and the potential of the wiring TX_[nm2] is changed from the potential LTX_[nm2] to the potential HTX_[nm2]. When the potentials of the wiring TX_[nm1] and the wiring TX_[nm2] are changed to the potential HTX_[nm1] and the potential HTX_[nm2], respectively, the transistor 211 is turned on. At the time T1, the wirings SE_[1] to SE_[n+1] are supplied with the potentials LSE_[1] to LSE_[n+1], respectively.

Next, at a time T2, the potential of the wiring PR_[m] is changed from the potential HPR_[m] to the potential LPR_[m]. At the time T2, the potentials of the wiring TX_[nm1] and the wiring TX_[nm2] are kept at the potential HTX_[nm1] and the potential HTX_[nm2], respectively, and the potentials of the wirings SE_[1] to SE_[n+1] are kept at the potentials LSE_[1] to LSE_[n+1], respectively. Accordingly, the node FD_[n] and the node FD_[n+1] are supplied with the potential HPR_[m]; thus, the amounts of charge held at the node FD_[n] and the node FD_[n+1] are reset. A period from the time T1 to the time T2 is called "reset period 300" and an operation during the reset period 300 is called "reset operation".

Here, for simplicity, the potential of the wiring PR_[m] and the potentials of the wiring TX_[nm1] and the wiring TX_[nm2] are changed at the time T1. However, it is acceptable that the potentials of the wiring TX_[nm1] and the wiring TX_[nm2] are changed before the potential of the wiring PR_[m] is changed. By turning on the transistor 211 before the potential of the wiring PR_[m] is changed, the node FD_[n] and the node FD_[n+1] can be reset completely.

Although not illustrated in FIG. 4, not only the amount of charge held at the node FD_[n] and the node FD_[n+1] but also the amount of charge held at the nodes FD in all the photosensors of the pixels in the m-th column (e.g., the node FD_[1] and the node FD_[2]) are reset.

Then, at the time T2, the potential of the wiring PR_[m] is changed to the potential LPR_[m], so that a reverse bias voltage is applied to the photodiode 207. Then, when light enters the photodiode 207 in a state where a reverse bias voltage is applied to the photodiode 207, current flows from the cathode of the photodiode 207 toward the anode thereof. The value of the current varies depending on the intensity of light. In other words, as the intensity of light entering the photodiode 207 increases, the value of the current increases and the amount of charge leaking out from the node FD_[n] and the node FD_[n+1] also increases. In contrast, as the intensity of light entering the photodiode 207 decreases, the value of the current decreases and the amount of charge leaking out from the node FD_[n] and the node FD_[n+1] decreases. Therefore, the higher the intensity of light becomes, the larger the amount of change in the potential of the node FD_[n] and the node FD_[n+1] becomes; the lower the intensity of light becomes, the smaller the amount of change becomes.

Then, at a time T3, the potential of the wiring TX_[nm1] is changed from the potential HTX_[nm1] to the potential LTX_[nm1] and the potential of the wiring TX_[nm2] is changed from the potential HTX_[nm2] to the potential LTX_[nm2], so that the transistor 211 is turned off. Accordingly, the movement of charge from the node FD_[n] and the node FD_[n+1] to the photodiode 207 is stopped; thus, the potentials of the node FD_[n] and the node FD_[n+1] are determined. A period from the time T2 to the time T3 is called "exposure period 301" and an operation during the exposure period 301 is called "accumulation operation".

Next, at a time T4, the potential of the wiring SE_[1] connected to the photosensor 205 of the pixel in the first row is changed from the potential LSE_[1] to the potential HSE_[1], so that the transistor 217 included in the photosensor 205 of the pixel in the first row is turned on. Then, depending on the potential of the node FD_[1] (not shown) in the photosensor 205 in the first row, charge is moved from the wiring VR_[m] to the wiring OUT_[m].

Next, at a time T5, the potential of the wiring SE_[1] is changed from the potential HSE_[1] to the potential LSE_[1], so that the movement of charge from the wiring VR_[m] to the wiring OUT_[m] in the pixel in the first row is stopped and the potential of the wiring OUT_[m] in the pixel in the first row is determined. The potential of the wiring OUT_[m] in the pixel in the first row corresponds to the potential of the output signal of the photosensor 205 of the pixel in the first row and the m-th column. In addition, the potential of the output signal contains object image data generated by the pixel in the first row and the m-th column. A period from the time T4 to the time T5 is called "readout period 302" and an operation during the readout period 302 is called "read operation". The timing of when the wiring SE_[1] is subjected to the read operation can be determined as appropriate.

From the time T5, the wirings SE_[2] to SE_[n+1] are also subjected to the read operation in sequence, so that the potential of the wiring OUT_[m] is determined in sequence as shown in FIG. 4. The potential of the wiring OUT_[m] determined in sequence corresponds to the potential of an output signal of the photosensor 205 of the pixel in the m-th column. The potential of the output signal contains object image data generated by the pixel in the m-th column.

The above-described series of operations includes a reset operation, an accumulation operation, and a read operation. In other words, object image data can be obtained by performing the reset operation, the accumulation operation, and the read operation on the pixels in all the columns.

In the global shutter method, all the pixels are subjected to the reset operation and the accumulation operation at a time, so that the wirings TX for the pixels in all the columns change in potential at a time in the same manner as the wiring TX_[nm1] and the wiring TX_[nm2].

A period between the end of the accumulation operation and the start of the read operation, during which charge is held at the nodes FD in the pixels in each column, is called "charge holding period". In the global shutter method, all the pixels are subjected to the reset operation and the accumulation operation at a time; therefore, the timing of the end of the exposure period is the same in all the pixels; however, the pixels are sequentially subjected to the read operation row by row, so that the length of the charge holding period varies from one row to another. For example, the charge holding period for the pixels in the first row is between the time T3 and the time T4, and the charge holding period for the pixels in the second row is between the time T3 and the time T5. The read operation is performed row by row; therefore, the timing of when the readout period is started varies from one row to another. Thus, the length of the charge holding period for the photosensors in the pixels in the last row is the longest.

When an image of a uniform grayscale level is obtained, the photosensors in all the pixels ideally provide output signals having potentials of the same level. However, in the case where the length of the charge holding period varies from one pixel row to another, if charge accumulated at the nodes FD in the pixels in each row leaks out over time, the potential of an output signal of a photosensor varies from one row to another, and image data varies in grayscale level from one row to another.

However, in one embodiment of the present invention, the transistor 211 with significantly small off-state current can be used as a switching element for holding charge accumulated in the photosensor 205, specifically, charge accumulated at the node FD. In that case, even when an image is taken by the global shutter method, it is possible to suppress variations in the grayscale level of image data due to variations in the length of the charge holding period, and it is possible to improve the quality of an image.

Note that the driving method according to the timing chart in FIG. 4 is a general global shutter method, and thus is called "normal GS driving method".

In the case where the normal GS driving method is performed using the circuit configuration illustrated in FIGS. 2A and 2B and FIGS. 3A and 3B, it is possible that image data of the n-th row and image data of the (n+1)-th row are mixed; however, the mixing of these image data can be prevented because the transistor 213 has extremely low off-state current density.

In the case of imaging using the normal GS driving method, when the luminance of external light is low and the intensity of light entering the photodiode of each pixel is low, the amount of charge flowing out from the node FD during the accumulation operation is small and a change in the potential of the node FD is small. The change can be increased by extending the exposure period; however, extending the exposure period may result in a reduction in the quality of an image, for example, obtainment of data of a distorted image of an object.

By using the pixel configuration illustrated in FIGS. 2A and 2B and FIGS. 3A and 3B, a driving method that suppresses such possibility can be performed. A description will be now given of a driving method according to one embodiment of the present invention, which is different from the normal GS driving method.

Specifically, in this driving method, the transistor 215 illustrated in FIGS. 2A and 2B and FIGS. 3A and 3B is turned on and electrical continuity between the photosensor of the pixel in the n-th row and the photosensor of the pixel in the (n+1)-th row is established, so that a region of a photodiode which light enters is increased and a change in the potential of the node FD (specifically, the node FD_[n]) is increased without extending the exposure period.

Since electrical continuity between the photosensor of the pixel in the n-th row and the photosensor of the pixel in the (n+1)-th row is established, the resolution of obtained data of an image of an object is lower than that obtained in the case where such electrical continuity is not established. However, the driving method described below is preferable because, in the environment where the luminance of external light is low, imaging in which the resolution is reduced and the exposure period is not extended results in higher quality of an image than imaging in which the exposure period is extended. Note that the driving method described below is called "light-entrance-region-increasing GS driving method" such that it is distinguished from the normal GS driving method.

Like the normal GS driving method, the light-entrance-region-increasing GS driving method according to one embodiment of the present invention is described taking the pixels in the m-th column in the pixel portion 101 as an example. FIG. 5 is an example of a timing chart showing potentials applied to the wiring TX_[nm1], the wiring TX_[nm2], the wirings SE_[1] to SE_[n+1], the wiring PA_[m], the wiring PR_[m], the wiring VR_[m], and the wiring OUT_[m] in the light-entrance-region-increasing GS driving method. FIG. 5 also shows the potentials of the node FD_[n] and the node FD_[n+1].

The light-entrance-region-increasing GS driving method is different from the driving method according to the timing chart of FIG. 4 in potentials applied to the wiring TX_[nm2] and the wiring PA_[m] and the potentials of the node FD_[n] and the wiring OUT_[m]. Here, the light-entrance-region-increasing GS driving method is described with reference to the description of the normal GS driving method.

In the light-entrance-region-increasing GS driving method, in order to establish electrical continuity between the photosensor of the pixel in the n-th row and the photosensor of the pixel in the (n+1)-th row, the potential LTX_[nm2] is always applied to the wiring TX_[nm2]. Therefore, the node FD_[n+1] is always at a low level.

First, the reset period 300 is described. At a time T1, the potential of the wiring PR_[m] is changed from the potential LPR_[m] to the potential HPR_[m]. Further, only the wiring TX_[nm1] for the photosensor of the pixel in the n-th row is changed from the potential LTX_[nm1] to the potential HTX_[nm1]. Accordingly, only the transistor 211 in the photosensor of the pixel in the n-th row is turned on. At the time T1, the potentials LSE_[1] to LSE_[n+1] are applied to the wirings SE_[1] to SE_[n+1], respectively.

Next, at a time T2, the potential of the wiring PR_[m] is changed from the potential HPR_[m] to the potential LPR_[m]. At the time T2, the potential of the wiring TX_[nm1] is kept at the potential HTX_[nm1], and the potentials of the wirings SE_[1] to SE_[n+1] are kept at the potentials LSE_[1] to LSE_[n+1], respectively. Accordingly, the node FD_[n] is supplied with the potential HPR_[m]; thus, the amount of charge held at the node FD_[n] is reset.

Here, for simplicity, the potential of the wiring PR_[m] and the potential of the wiring TX_[nm1] are changed at the time T1. However, it is acceptable that the potential of the wiring TX_[nm1] is changed before the potential of the wiring PR_[m] is changed. By turning on the transistor 211 before the potential of the wiring PR_[m] is changed, the node FD_[n] can be reset completely.

Although not illustrated in FIG. 5, not only the amount of charge held at the node FD_[n] but also the amount of charge held at the nodes FD in the photosensors of the pixels in the m-th column and odd-numbered rows (e.g., the node FD_[1] and the node FD_[3]) are reset.

Next, the exposure period 301 is described. At the time T2, the potential of the wiring PR_[m] is changed to the potential LPR_[m]. Further, at the time T2, after the potential of the wiring PR_[m] is changed, the potential of the wiring PA_[m] is changed from the potential LPA_[m] to the potential HPA_[m]. Consequently, the transistor 213 is turned on, so that electrical continuity between the photosensor of the pixel in the n-th row and the photosensor of the pixel in the (n+1)-th row is established. Thus, the photodiode 207 of the pixel in the n-th row and the photodiode 207 of the pixel in the (n+1)-th row are connected in parallel. This produces the same effect as that produced by increasing a region of a photodiode which light enters, thereby increasing the amount of charge flowing out during a certain period from the node FD_[n] reset.

At the time T3, the potential of the wiring TX_[nm1] is changed from the potential HTX_[nm1] to the potential LTX_[nm1], so that the transistor 211 is turned off. Accordingly, the movement of charge from the node FD_[n] to the photodiode 207 is stopped; thus, the potential of the node FD_[n] is determined. This produces the same effect as that produced by increasing a region of a photodiode which light enters, thereby increasing the amount of charge flowing out during a certain period from the node FD_[n] reset.

Next, the readout period 302 is described. From the time T4, the driving method is performed according to the timing chart of FIG. 5 in the same manner as that indicated with the timing chart of FIG. 4. The wirings SE_[1] to SE_[n+1] are subjected in sequence to the operation performed during the readout period 302, so that the potential of the wiring OUT_[m] is determined in sequence as shown in FIG. 5. The potential of the wiring OUT_[m] determined in sequence corresponds to the potential of an output signal of the photosensor 205 of the pixel in the m-th column. The potential of the output signal contains object image data generated by the pixel in the m-th column.

Note that in the pixel in the n-th row, as in the normal GS driving method, the potential of the wiring OUT_[m] in the pixel in the n-th row is determined. This potential contains image data generated by the pixel in the m-th column. Since in the pixel in the (n+1)-th row, the wiring TX_[nm2] is always at the potential LTX_[nm2], the potential of the wiring OUT_[m] in the (n+1)-th row is not changed even when the wiring SE_[n+1] is changed to the potential HSE_[n+1]. Therefore, the potential of the output signal is not output.

However, according to the the timing chart of FIG. 5, the wirings SE_[1] to SE_[n+1] are subjected in sequence to the operation performed during the readout period 302; therefore, it is possible that the potential of the wiring OUT_[m] for the pixel in the (n+1)-th row slightly changes. In other words, it is possible that an output signal with a potential lower than the potential of the output signal of the n-th row is output from the (n+1)-th row; in such a case, image data corresponding to the potential of an output signal of the pixel in the n-th row is removed. For example, the data processing circuit 107 in the solid-state imaging device 100 (see FIG. 1A) is provided with a circuit for removing such image data. The timing of when the wiring SE_[1] is subjected to the read operation can be determined as appropriate.

Object image data can be obtained by performing the reset operation, the accumulation operation, and the read operation on the pixels in all the columns.

The light-entrance-region-increasing GS driving method employs the global shutter method like the normal GS driving method. Therefore, the length of the charge holding period varies from one row to another. Thus, the length of the charge holding period for the photosensors of the pixels in the last row is the longest. When an image of a uniform grayscale level is obtained, the photosensors in all the pixels ideally provide output signals having potentials of the same level. However, also in the light-entrance-region-increasing GS, in the case where the length of the charge holding period varies from one pixel row to another, if charge accumulated at the nodes FD in the pixels in each row leaks out over time, the potential of an output signal of a photosensor varies from one row to another, and image data varies in grayscale level from one row to another.

In view of the above problem, the transistor 211 with significantly small off-state current can be used as a switching element for holding charge accumulated in the photosensor 205, specifically, charge accumulated at the node FD. Thus, it is possible to suppress variations in the grayscale level of image data due to variations in the length of the charge holding period, and it is possible to improve the quality of an image.

As described above, the solid-state imaging device 100 according to one embodiment of the present invention can employ the normal GS driving method and the light-entrance-region-increasing GS driving method in combination. For example, when the luminance of external light is high, the normal GS driving method is employed to determine, after imaging, whether image contains much data representing black (whether the imaging has been conducted in the dark) with the data processing circuit 107. When it is determined that the image data contains much data representing black (whether the imaging has been conducted in the dark), the driving method can be switched to the light-entrance-region-increasing GS driving method. Note that the switching can be performed either automatically with the data processing circuit 107 or by a user.

The solid-state imaging device 100 according to one embodiment of the present invention has the circuit configuration illustrated in FIGS. 2A and 2B and FIGS. 3A and 3B, enables adjustment of the exposure period, is capable of employing the normal GS driving method and the light-entrance-region-increasing GS driving method in combination, and has improved dynamic range.

In FIGS. 2A and 2B and FIGS. 3A and 3B, in a group of the pixels in the same column, a photodiode of a pixel in one row and a photodiode of a pixel in the next row are connected to each other with a transistor (a switching element). In the solid-state imaging device 100 according to one embodiment of the present invention, the number of photodiodes connected to each other can be determined as appropriate. For example, in a pixel group in the same column, either three or four rows of photodiodes can be connected to one another.

Since the solid-state imaging device 100 according to one embodiment of the present invention can employ the normal GS driving method and the light-entrance-region-increasing GS driving method in combination, it is acceptable that only part of the region of the pixel portion 101 is operated by the light-entrance-region-increasing GS driving method, and the other region is operated by the normal GS driving method.

Figure 6A:
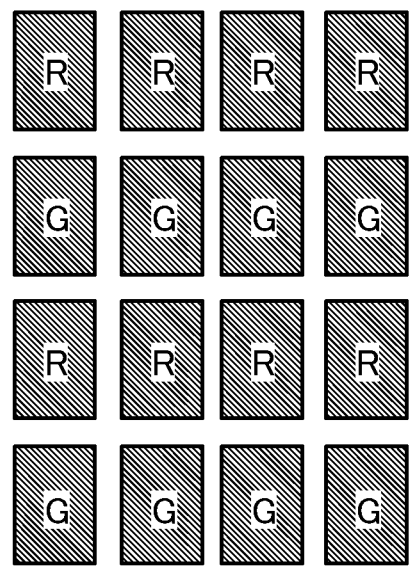
FIGS. 6A and 6B are diagrams illustrating one embodiment of color filters.
Figure 6B:
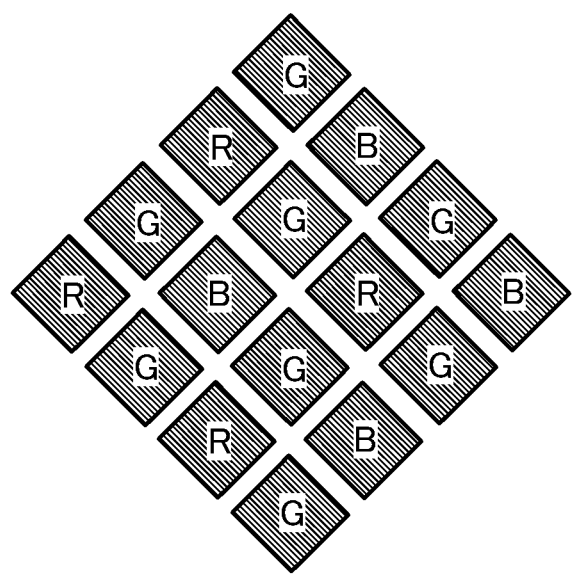

In the solid-state imaging device 100 according to one embodiment of the present invention, a plurality of pixels arranged in a matrix in the pixel portion 101 is provided with color filters. The arrangement and shape of the color filters are not particularly limited. For example, the color filters may have a rectangular shape as illustrated in FIG. 6A or a diamond shape as illustrated in FIG. 6B. Note that the arrangement and shape of wirings in the plurality of pixels and wirings in the photosensors of each pixel are changed as appropriate according to the arrangement and shape of the color filters.

The solid-state imaging device 100 according to one embodiment of the present invention may perform imaging by using external light or by sequential emission of at least red light, blue light, and green light to obtain color image data. By sequential emission of these lights, a plurality of pieces of image data corresponding to a plurality of colors can be obtained. Color image data can be obtained by addictive color mixture using the plurality of pieces of image data.

Sequential emission of these lights eliminates the need for providing each pixel with color filters. By increasing the use efficiency of these lights, the power consumption of the solid-state imaging device can be reduced. Further, since image data corresponding to a plurality of colors can be obtained or the grayscale levels of a plurality of colors can be produced with one pixel, high-definition image data can be obtained.

In the solid-state imaging device 100 according to one embodiment of the present invention, when light enters the photodiode of the photosensor, an output signal generated from the light is output. Thus, the solid-state imaging device 100 can be operated utilizing not only visible light but also light with various wavelengths (e.g., infrared rays, ultraviolet rays, and X rays). For example, a solid-state imaging device can utilize X rays when provided with a layer with which X rays can be converted into visible light, such as a phosphor.

This embodiment can be implemented in appropriate combination with any of the structures described in the other embodiments.

Embodiment 2

This embodiment describes the case where the solid-state imaging device 100 employs the rolling shutter method.

The rolling shutter method is different from the global shutter method described in Embodiment 1 in that the potentials applied to the wirings PR for respective rows are sequentially varied; therefore, the wirings PR are independently provided for the respective rows. FIG. 7 illustrates an example of a circuit diagram of the pixel portion 101. FIG. 7 illustrates the pixels in the n-th row and the (n+1)-th row.

In the case where the rolling shutter method is employed, the potentials applied to the wirings PR for respective rows are sequentially varied; therefore, the solid-state imaging device 100 in FIG. 1A to which a horizontal reset circuit is added is used. The horizontal reset circuit is connected to the wiring PR in each row and includes at least a logic circuit unit, a switch unit, or a buffer unit, like the horizontal selection circuit 103, the data output circuit 105, and the data processing circuit 107. The horizontal reset circuit can be formed over the same substrate as the pixel portion 101. Alternatively, the horizontal reset circuit may be partly or fully implemented in a semiconductor device such as an IC.

Note that when the rolling shutter method is employed, the charge holding period described in Embodiment 1 is not used. Therefore, in the circuit configuration in FIG. 7, the transistor 211 is not necessarily provided in the amplifier circuit 209 as long as the amplifier circuit 209 amplifies current generated by the photodiode 207. When the transistor 211 is not provided, the photosensors and the pixels can be miniaturized, so that the solid-state imaging device can be miniaturized and manufacturing cost can be reduced.

Figure 8:
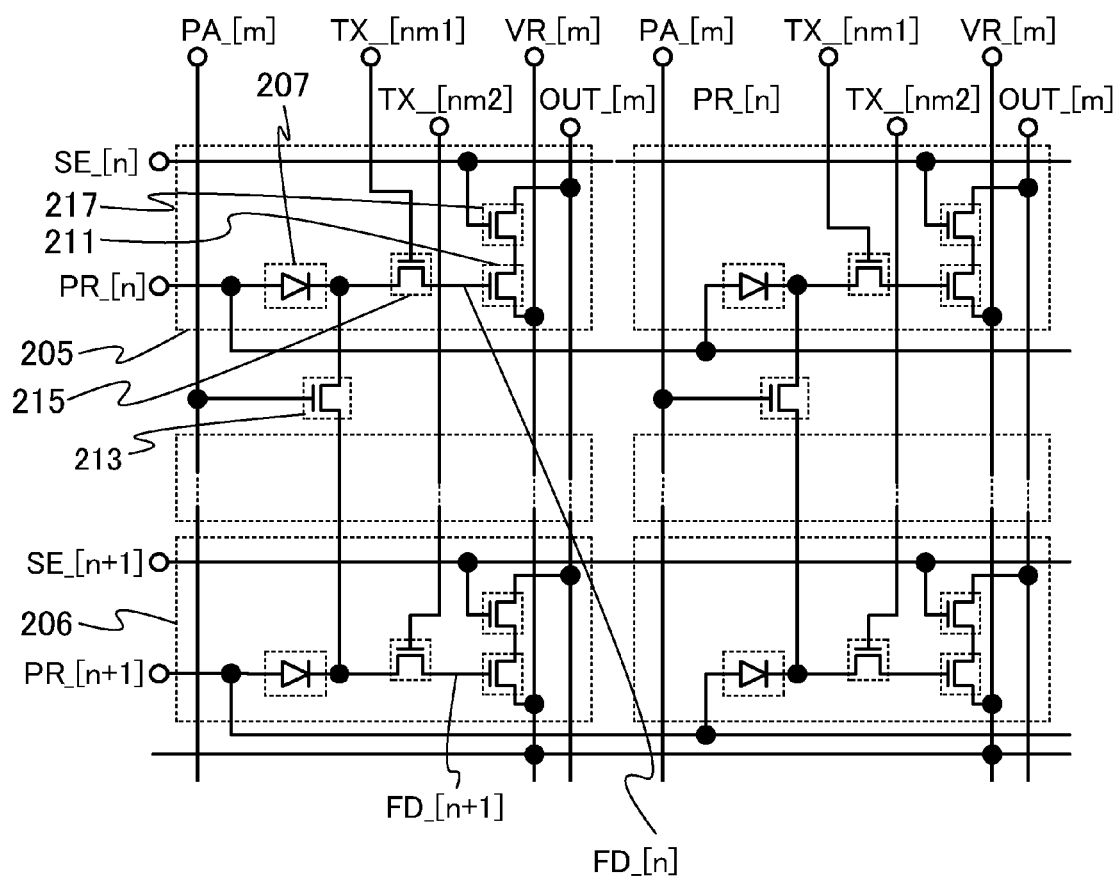
FIG. 8 is a circuit diagram of a pixel portion.

FIG. 8 is a circuit diagram showing the case where the photosensors 205 and 206 in FIG. 7 having the same structure as the photosensor 205 in FIG. 3A are used. Note that FIG. 8 illustrates pixels in the n-th and (n+1)-th rows of the m-th column.

The wirings PR are independently provided for the respective rows as described above, so that the anode of the photodiode 207 of the photosensor 205 in the n-th row is connected to a wiring PR_[n] among the wirings PR. The anode of the photodiode 207 of the photosensor 206 in the (n+1)-th row is connected to a wiring PR_[n+1] among the wirings PR. Thus, when the rolling shutter method is employed, the wiring PR_[n] and the wiring PR_[n+1] are used instead of the wiring PR_[m] in FIG. 3B.

Next, a method for driving the pixel portion 101 by the rolling shutter method is described. FIG. 9 is an example of a timing chart showing potentials applied to the wiring TX_[nm1], the wiring TX_[nm2], the wiring PA_[m], the wiring VR_[m], and the wiring OUT_[m] for the pixels in the m-th column in the pixel portion 101. FIG. 9 is also an example of a timing chart showing potentials applied to the wirings SE_[1] to SE_[n+1] and the wirings PR_[1] to PR_[n+1] for the pixels in rows in the pixel portion 101. Further, FIG. 9 shows the potentials of the node FD_[n] and the node FD_[n+1].

It is assumed that, in the timing chart shown in this embodiment, high or low level potentials are applied to the wirings as in Embodiment 1. This embodiment is different from Embodiment 1 in that the wirings PR [1] to PR_[n+1] are supplied with high level potentials HPR_[1] to HPR_[n+1], respectively, and low level potentials LPR_[1] to LPR_[n+1], respectively. The potentials supplied to the other wirings are the same as those in Embodiment 1. The VR_[m] is assumed to be supplied with VDD, which is not shown in FIG. 9.

FIG. 9 is a timing chart of the driving method in a condition where there is no electrical continuity between the photodiode 207 in the photosensor 205 in the n-th row and the photodiode 207 in the photosensor 206 in the (n+1)-th row, that is, a condition where the transistor 213 is in the off state. In the driving method, the wiring PA_[m] is always at a potential LPA_[m]. Since the rolling shutter method is employed, the wirings TX_[nm1] and TX_[nm2] are always at potentials HTX_[nm1] and HTX_[nm2], respectively. Therefore, the transistor 211 in the photosensor 205 of the pixel in the n-th row and the transistor 211 in the photosensor 206 of the pixel in the (n+1)-th row are always in the on state.

First, at the time T1, the potential of the wiring PR_[1] is changed from the potential LPR_[1] to the potential HPR_[1]. Further, at the time T1, low level potentials are supplied to the other wirings.

Next, at the time T2, the potential of the wiring PR_[1] is changed to the potential HPR_[1]. A period from the time T1 to the time T2 corresponds to the reset period 300 described in Embodiment 1. However, since the rolling shutter method is employed, unlike in the global shutter method shown in Embodiment 1, the rows are sequentially subjected to a reset operation in the reset period 300. Thus, the potential of the wiring PR_[2] is changed from the potential LPR_[2] to the potential HPR_[2] at the time T2 and the potential of the wiring PR_[2] is changed from the potential HPR_[2] to the potential LPR_[2] at the time T3 to subject the photosensors in the second row to a reset operation. Note that at the time T2 and the time T3, low level potentials are supplied to the other wirings.

FIG. 9 shows the timing of when the photosensor 205 in the n-th row and the photosensor 206 in the (n+1)-th row are subjected to a reset operation when the sequential reset operation is performed.

Here, at the time T2, the potential of the wiring PR_[1] is changed to the potential LPR_[1], so that a reverse bias voltage is applied to the photodiode 207 in the first row. As described in Embodiment 1, when light enters the photodiode 207, current flows from the cathode of the photodiode 207 toward the anode thereof. This current determines the potential of the node FD_[1] (not shown) of the photosensor 205 in the first row. Note that, as described in Embodiment 1, the higher the intensity of light entering the node FD_[1] becomes, the larger the amount of change in the potential of the node FD_[1] becomes; the lower the intensity of light entering the node FD_[1] becomes, the smaller the amount of change in the potential of the node FD_[1] becomes.

Next, at the time T4, the potential of the wiring SE_[1] connected to the photosensors 205 of the pixels in the first row is changed from the potential LSE_[1] to the potential HSE_[1], so that the transistors 217 included in the photosensors 205 of the pixels in the first row are turned on. Then, depending on the potentials of the node FD_[1], charge is moved from the wiring VR_[m] to the wiring OUT_[m].

Since the wirings TX_[nm1] and TX_[nm2] are always at potentials HTX_[nm1] and HTX_[nm2], respectively, changing the potential of the wiring SE_[1] from the potential LSE_[1] to the potential HSE_[1] determines the potential of the node FD_[1]. Therefore, the exposure period 301 for the photosensor 205 in the first row corresponds to a period from the time T2 to the time T4, and the operation during the exposure period 301 is an accumulation operation.

Next, at the time T5, the potential of the wiring SE_[1] is changed from the potential HSE_[1] to the potential LSE_[1], so that the movement of charge from the wiring VR_[m] to the wiring OUT_[m] in the pixel in the first row is stopped and the potential of the wiring OUT_[m] in the pixel in the first row is determined. The potential of the wiring OUT_[m] in the pixel in the first row corresponds to the potential of the output signal of the photosensor 205 of the pixel in the first row and the m-th column. In addition, the potential of the output signal contains object image data generated by the pixel in the first row and the m-th column. The readout period 302 for the photosensor 205 in the first row corresponds to a period from the time T4 to the time T5, and the operation during the readout period 302 is referred to as a read operation. The timing of when the wiring SE_[1] is subjected to the read operation can be determined as appropriate.

From the time T5, the wirings SE_[2] to SE_[n+1] are also subjected to the read operation in sequence, so that the potential of the wiring OUT_[m] is determined in sequence as shown in FIG. 9. The potential of the wiring OUT_[m] determined in sequence corresponds to the potential of an output signal of the photosensor 205 of the pixel in the m-th column. The potential of the output signal contains object image data generated by the pixel in the m-th column.

From the time T1, the wirings PR_[2] to PR_[n+1] are subjected to the reset operation in sequence. From the time T5, the wirings SE_[2] to SE_[n+1] are also subjected to the read operation in sequence. Therefore, in a normal RS driving method, the exposure period 301 for the photosensor 206 in the (n+1)-th row corresponds to a period from the time at which the potential of the PR_[n+1] is changed from the potential HPR_[n+1] to the potential LPR_[n+1] to the time at which the potential of the wiring SE_[n+1] is changed from the potential LSE_[n+1] to the potential HSE_[n+1].

Further, since the wirings TX_[nm1] and TX_[nm2] are always at the potentials HTX_[nm1] and HTX_[nm2], respectively, the potentials of the nodes FD_[n] and FD_[n+1] decrease until the reset operation for the photosensor 205 in the n-th row and the photosensor 206 in the (n+1)-th row is performed again.

Object image data can be obtained by performing the reset operation, the accumulation operation, and the read operation on the pixels in all the columns.

Note that the driving method according to the timing chart in FIG. 9 is a general rolling shutter method, and thus is called "normal RS driving method".

In the case where the normal RS driving method is performed using the circuit configuration illustrated in FIG. 7 and FIG. 8, it is possible that image data of the n-th row and image data of the (n+1)-th row are mixed; however, the mixing of these image data can be prevented because the transistor 213 has significantly small off-state current.

In the case where the normal RS driving method is employed, when the luminance of external light is low and the intensity of light entering the photodiode of each pixel is low, the amount of charge flowing out from the node FD during the accumulation operation is small and a change in the potential of the node FD is small. The change can be increased by extending the exposure period; however, extending the exposure period may result in a reduction in the quality of an image, for example, obtainment of data of a distorted image of an object.

Like in Embodiment 1, by using the pixel configuration illustrated in FIG. 7 and FIG. 8, a driving method that suppresses such possibility can be performed. A description will be now given of a driving method according to one embodiment of the present invention, which is different from the normal RS driving method.

Specifically, in this driving method, the transistor 215 illustrated in FIG. 7 and FIG. 8 is turned on and electrical continuity between the photosensor 205 of the pixel in the n-th row and the photosensor 206 of the pixel in the (n+1)-th row is established, so that a region of a photodiode which light enters is increased and a change in the potential of the node FD (specifically, the node FD_[n]) is increased without extending the exposure period.

Since electrical continuity between the photosensor 206 of the pixel in the n-th row and the photosensor 206 of the pixel in the (n+1)-th row is established, the resolution of obtained data of an image of an object is lower than that obtained in the case where such electrical continuity is not established. However, the driving method described below is preferable because, in the environment where the luminance of external light is low, imaging achieved by reducing resolution without extending the exposure period results in the quality of a taken image higher than that resulting from imaging achieved by extending the exposure period. Note that the driving method described below is called "light-entrance-region-increasing RS driving method" such that it is distinguished from the normal RS driving method.

Like the normal RS driving method, the light-entrance-region-increasing RS driving method according to one embodiment of the present invention is described taking the pixels in the m-th column in the pixel portion 101 as an example. FIG. 10 is an example of a timing chart showing potentials applied to the wiring TX_[nm1], the wiring TX_[nm2], the wiring PA_[m], the wiring VR_[m], and the wiring OUT_[m] in the light-entrance-region-increasing RS driving method. FIG. 10 is also an example of a timing chart showing potentials applied to the wirings SE_[1] to SE [n+1] and the wirings PR_[1] to PR_[n+1] for the pixels in the columns in the pixel portion 101. Further, FIG. 10 shows the potentials of the node FD_[n] and the node FD_[n+1].

The light-entrance-region-increasing RS driving method is different from the driving method according to the timing chart of FIG. 9 in potentials applied to the wiring TX_[nm2] and the wiring PA_[m] and the potentials of the node FD_[n] and the wiring OUT_[m]. Here, the light-entrance-region-increasing RS driving method is described with reference to the description of the normal RS driving method.

In the light-entrance-region-increasing RS driving method, in order to establish electrical continuity between the photosensor 205 of the pixel in the n-th row and the photosensor 206 of the pixel in the (n+1)-th row, the potential LTX_[nm2] is always applied to the wiring TX_[nm2]. Therefore, the node FD_[n+1] is always at a low level. The transistor 211 in the photosensor 206 of the pixel in the (n+1)-th row is always in the off state.

The wiring TX_[nm1] is always at the potential HTX_[nm1]. Consequently, the transistor 211 in the photosensor 205 of the pixel in the n-th row is always in the on state. Thus, the photodiode 207 of the pixel in the n-th row and the photodiode 207 of the pixel in the (n+1)-th row are connected in parallel. This produces the same effect as that produced by increasing a region of a photodiode which light enters, thereby increasing the amount of charge flowing out during a certain period from the node FD_[n] reset.

The reset period 300 is described. At the time T1, the potential of the wiring PR_[1] is changed from the potential LPR_[1] to the potential HPR_[1]. Further, at the time T1, low level potentials are applied to the other wirings.

Next, at the time T2, the potential of the wiring PR_[1] is changed from the potential HPR_[1] to the potential LPR_[1]. A period from the time T1 to the time T2 corresponds to the reset period 300 like in the normal RS driving method.

In the light-entrance-region-increasing RS driving method, it is preferable that the sequential reset operation be performed every other row. In the light-entrance-region-increasing RS driving method, when the rows are sequentially subjected to a reset operation like in the normal RS driving method, the exposure period 301 for the photosensor 205 in the n-th row corresponds to a period from the time at which the potential of the wiring PR_[n+1] is changed from the potential HPR_[n+1] to the potential LPR_[n+1] to the time at which the potential of the wiring SE_[n] is changed from the potential LSE_[n] to the potential HSE_[n]. This is because there is electrical continuity (parallel connection) between the photodiode 207 of the photosensor 205 in the n-th row and the photodiode 207 of the photosensor 206 in the (n+1)-th row, so that the reset period 300 for the photosensor 206 in the (n+1)-th row also starts when the exposure period 301 for the photosensor 205 in the n-th row starts; thus, the photosensor 205 in the n-th row is subjected to a reset operation again. In other words, in the light-entrance-region-increasing RS driving method, when the rows are sequentially subjected to a reset operation, the exposure period 301 is reduced to shorter than that in the normal RS driving method.

Note that in the light-entrance-region-increasing RS driving method, when the rows are sequentially subjected to a reset operation like in the normal RS driving method, by delaying the timing of when the potential of the wiring SE_[n+1] is changed from the LSE_[n+1] to the potential HSE_[n+1] by the width of a pulse input to the time wiring PR_[n+1], the length of the exposure period 301 for the photosensor 205 in the n-th row and that of the exposure period 301 for the photosensor 205 in the n-th row in the normal RS driving method can be equalized.

In the description below, it is assumed that only the photosensors 205 in the n-th row are subjected to a sequential reset operation. After the reset operation, when light enters the photodiode 207 of the photosensor 205 in the n-th row, current flows from the cathode of the photodiode 207 to the anode thereof, as in the normal RS driving method. This current determines the potential of the node FD_[n] of the photosensor 205 in the n-th row. Note that the higher the intensity of light entering the node FD_[n] becomes, the larger the amount of change in the potential of the node FD_[n] becomes; the lower the intensity of light entering the node FD_[n] becomes, the smaller the amount of change in the potential of the node FD_[n] becomes.

From the time T4, the wirings SE_[1] to SE [n+1] are subjected to the read operation in sequence at the same timings as in the normal RS driving method, so that the potential of the wiring OUT_[m] is determined in sequence as shown in FIG. 10. In the photosensor 206 in the (n+1)-th row, the potential of the wiring OUT_[m] is a potential LOUT_[m]. The potential of the wiring OUT_[m] determined in sequence corresponds to the potential of an output signal of the photosensor 205 of the pixel in the m-th column. The potential of the output signal contains object image data generated by the pixel in the m-th column. The timing of when the wiring SE_[1] is subjected to the read operation can be determined as appropriate.

Since the wiring TX_[nm1] is always at a potential HTX_[nm1], the potential of the node FD_[n+1] decreases until the reset operation for the photosensor 206 in the (n+1)-th row is performed again.

Object image data can be obtained by performing the reset operation, the accumulation operation, and the read operation on the pixels in all the columns.

The solid-state imaging device 100 according to one embodiment of the present invention can employ the normal RS driving method and the light-entrance-region-increasing RS driving method in combination. For example, when the luminance of external light is high, the normal RS driving method is employed to determine, after imaging, whether image contains much data representing black (whether the imaging has been conducted in the dark) with the data processing circuit 107. When it is determined that the image data contains much data representing black (whether the imaging has been conducted in the dark), the driving method can be switched to the light-entrance-region-increasing RS driving method. Note that the switching can be performed either automatically with the data processing circuit 107 or by a user.

The solid-state imaging device 100 according to one embodiment of the present invention has the circuit configuration illustrated in FIG. 7 and FIG. 8, enables adjustment of the exposure period 301, is capable of employing the normal RS driving method and the light-entrance-region-increasing RS driving method in combination, and has improved dynamic range.

In FIG. 7 and FIG. 8, in a group of the pixels in the same column, a photodiode of a pixel in one row and a photodiode of a pixel in the next row are connected to each other with a transistor (a switching element). In the solid-state imaging device 100 according to one embodiment of the present invention, the number of photodiodes connected to each other can be determined as appropriate. For example, in a pixel group in the same column, either three or four rows of photodiodes can be connected to one another.

Since the solid-state imaging device 100 according to one embodiment of the present invention can employ the normal GS driving method and the light-entrance-region-increasing GS driving method in combination, it is acceptable that only one region of the pixel portion 101 is operated by the light-entrance-region-increasing GS driving method, and the other region is operated by the normal GS driving method.

In the solid-state imaging device 100 according to one embodiment of the present invention, a plurality of pixels arranged in a matrix in the pixel portion 101 is provided with color filters. The arrangement and shape of the color filters are not particularly limited. For example, the color filters may have a rectangular shape as illustrated in FIG. 6A or a diamond shape as illustrated in FIG. 6B. Note that the arrangement and shape of wirings in the plurality of pixels and wirings in the photosensors of each pixel are changed as appropriate according to the arrangement and shape the color filters.

The solid-state imaging device 100 according to one embodiment of the present invention may perform imaging by using external light or by sequential emission of red light, blue light, and green light in sequence to obtain color image data. By sequential emission of these lights, a plurality of pieces of image data corresponding to a plurality of colors can be obtained. Color image data can be obtained by addictive color mixture using the plurality of pieces of image data.

Sequential emission of these lights eliminates the need for providing each pixel with color filters. By increasing the use efficiency of these lights, the power consumption of the solid-state imaging device can be reduced. Further, since image data corresponding to a plurality of colors can be obtained or the grayscale levels of a plurality of colors can be produced with one pixel, high-definition image data can be obtained.

In the solid-state imaging device 100 according to one embodiment of the present invention, when light enters the photodiode of the photosensor, an output signal generated from the light is output. Thus, the solid-state imaging device 100 can be operated utilizing not only visible light but also light with various wavelengths (e.g., infrared rays, ultraviolet rays, and X rays). For example, a solid-state imaging device can utilize X rays when provided with a layer with which X rays can be converted into visible light, such as a phosphor.

This embodiment can be implemented in appropriate combination with any of the structures described in the other embodiments.

Embodiment 3

This embodiment describes a method for manufacturing a solid-state imaging device according to one embodiment of the present invention, taking a method for manufacturing the photosensor 205 illustrated in FIG. 3B as an example. Note that the transistor 217 can be manufactured in the same manner as the transistor 215, and thus is not illustrated in the diagrams used for the description below. The description of the transistor 215 applies to the transistor 217.

Note that in one embodiment of the present invention, an oxide semiconductor may be used for a channel formation region of the transistors 211 and 213, or a semiconductor such as germanium, silicon, silicon germanium, or single crystal silicon carbide may be used. For example, the transistor including silicon can be formed using a single crystal semiconductor substrate such as a silicon wafer or the like, a silicon thin film which is formed by an SOI method, a silicon thin film which is formed by a vapor deposition method, or the like. The transistors 211 and 213 preferably have extremely low off-state current density; therefore, an oxide semiconductor is used for their channel formation regions here.

First, as illustrated in FIG. 11A, a photodiode 207 and a transistor 215 are formed over an insulating surface of a substrate 700 by a known CMOS fabricating method. Note that the transistor 215 is an n-channel transistor.

As described in the above embodiment, the transistor 215 can also include an oxide semiconductor in a channel formation region. However, when a semiconductor material providing higher mobility than an oxide semiconductor, such as polycrystalline or single crystal silicon, is used, image data can be read from the photosensor 205 at high speed. This embodiment describes the case where the photodiode 207 and the transistor 215 are formed using a single crystal semiconductor film separated from a single crystal semiconductor substrate of any of semiconductors listed above.

A specific example of a method for manufacturing the single crystal semiconductor film will be briefly described. First, an ion beam including ions which are accelerated by an electric field is delivered to the single crystal semiconductor substrate and an embrittled layer which is weakened by local disorder of the crystal structure is formed in a region at a certain depth from the surface of the semiconductor substrate. The depth at which the embrittled layer is formed can be adjusted by the acceleration energy of the ion beam and the angle at which the ion beam is incident. Then, the semiconductor substrate and the substrate 700 which is provided with an insulating film 701 are attached to each other so that the insulating film 701 is sandwiched therebetween. After the semiconductor substrate and the substrate 700 are overlapped with each other, a pressure of, approximately, greater than or equal to 1 N/cm$^2$ and less than or equal to 500 N/cm$^2$, preferably greater than or equal to 11 N/cm$^2$ and less than or equal to 20 N/cm$^2$ is applied to part of the semiconductor substrate and the substrate 700 to attach both the substrates. When the pressure is applied, bonding between the semiconductor substrate and the insulating film 701 starts from the portion, which results in bonding of the entire surface where the semiconductor substrate and the insulating film 701 are in close contact with each other. Subsequently, heat treatment is performed, whereby microvoids that exist in the embrittled layer are combined, so that the volume of the microvoids increases. As a result, the single crystal semiconductor film which is part of the semiconductor substrate is separated from the semiconductor substrate along the embrittled layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The photodiode 207 is formed using the island-shaped semiconductor film 702 over the insulating film 701, and the transistor 215 is formed using the island-shaped semiconductor film 703 over the insulating film 701. The photodiode 207 is a lateral junction type in which a region 727 having p-type conductivity, a region 728 having i-type conductivity, and a region 729 having n-type conductivity are formed in the island-shaped semiconductor film 702. The transistor 215 includes a gate electrode 707. In addition, the transistor 215 includes an insulating film 708 between the island-shaped semiconductor film 703 and the gate electrode 707.

Note that the region 728 having i-type conductivity refers to a region of the semiconductor film which contains an impurity imparting p-type or n-type conductivity at a concentration of $1 \times 10^{20}$ cm$^{-3}$ or less and has photoconductivity 100 or more times as high as dark conductivity. The region 728 having i-type conductivity includes, in its category, that which contains an impurity element belonging to Group 13 or Group 15 of the periodic table. That is, an i-type semiconductor has weak n-type electric conductivity when an impurity element for controlling valence electrons is not added intentionally. Therefore, the region 728 having i-type conductivity includes, in its category, that to which an impurity element imparting p-type conductivity is added intentionally or unintentionally at the same time of film formation or after the film formation.

Although there is no particular limitation on a substrate which can be used as the substrate 700, it is at least necessary that the substrate have heat resistance sufficient to withstand heat treatment performed later. For example, a glass substrate manufactured by a fusion method or a float method, a quartz substrate, a ceramic substrate, or the like can be used as the substrate 700. When the temperature of the heat treatment performed later is high, it is preferable that a substrate having a strain point of 730° C. or higher be used as the glass substrate. Further, a metal substrate such as a stainless-steel substrate or a substrate in which an insulating film is formed over the surface of a silicon substrate may be used as well. Although a substrate formed of a flexible synthetic resin such as plastic generally has a lower heat resistance temperature than the aforementioned substrates, it may be used as long as being resistant to a processing temperature during manufacturing steps.

Note that although the case where the photodiode 207 and the transistor 215 are formed using the single crystal semiconductor film is described as an example in this embodiment, the present invention is not limited to this structure. For example, a polycrystalline or microcrystalline semiconductor film which is formed over the insulating film 701 by a vapor deposition method may be used. Alternatively, the above semiconductor film may be formed by being crystallized by a known technique. Known crystallization techniques include a laser crystallization method using a laser beam and a crystallization method using a catalytic element. Alternatively, a combination of a crystallization method using a catalytic element and a laser crystallization method may be used. When a heat-resistant substrate such as a quartz substrate is used, it is possible to combine any of the following crystallization methods: a thermal crystallization method using an electrically heated furnace, a lamp annealing crystallization method using infrared light, a crystallization method using a catalytic element, and a high-temperature annealing method at approximately 950° C.

Further, in FIG. 11A, after a conductive film is formed over the insulating film 708, the conductive film is processed into a desired shape by etching or the like, whereby a wiring 711 as well as the gate electrode 707 is formed. In other words, the gate electrode 707 and the wiring 711 are to be connected to a conductive film 720 of the transistor 211 fabricated later, so that the connections shown in the circuit diagram of FIG. 3B can be achieved.

Next, as illustrated in FIG. 11A, an insulating film 712 is formed so as to cover the photodiode 207, the transistor 215, and the wiring 711. Note that although the case where a single-layer insulating film is used as the insulating film 712 is described as an example in this embodiment, the insulating film 712 is not necessarily a single-layer film and may be a stacked insulating film including two or more layers.

The insulating film 712 is formed using a material which can withstand the temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 712.

In this specification, an oxynitride refers to a substance in which the amount of oxygen is larger than that of nitrogen, and a nitride oxide refers to a substance in which the amount of nitrogen is larger than that of oxygen.

A surface of the insulating film 712 may be planarized by a CMP method or the like.

Next, the transistor 211 and the transistor 213 are formed over the insulating film 712. As illustrated in FIG. 11A, a gate electrode 713 is formed over the insulating film 712.

The gate electrode 713 can be formed using one or more conductive films including a metal material such as molybdenum, titanium, chromium, tantalum, tungsten, neodymium, or scandium or an alloy material which contains any of these metal materials as a main component, or a nitride of any of these metals. The gate electrode 713 can be formed to have a single-layer structure or a stacked-layer structure. Note that aluminum or copper can also be used as such a metal material as long as it can withstand the temperature of heat treatment to be performed in a later step. Aluminum or copper is preferably used in combination with a refractory metal material in order to avoid problems with heat resistance and corrosion. As the refractory metal material, molybdenum, titanium, chromium, tantalum, tungsten, neodymium, scandium, or the like can be used.

For example, as a two-layer stacked structure of the gate electrode 713, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer stacked structure of the gate electrode 713, the following structure is preferable: a stacked structure including an aluminum film, an alloy film of aluminum and silicon, an alloy film of aluminum and titanium, or an alloy film of aluminum and neodymium as an intermediate layer and any of a tungsten film, a tungsten nitride film, a titanium nitride film, and a titanium film as a top layer and a bottom layer.

Further, a light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can also be used as the gate electrode 713.

The thickness of the gate electrode 713 is in the range of 10 nm to 400 nm, preferably 100 nm to 200 nm. In this embodiment, after a conductive film for the gate electrode is formed to have a thickness of 150 nm by a sputtering method using a tungsten target, the conductive film is processed (patterned) into a desired shape by etching, whereby the gate electrode 713 is formed. The gate electrode preferably has a tapered end portion because coverage with a gate insulating film to be stacked thereover can be improved. Note that a resist mask may be formed by an inkjet method. Formation of the resist mask by an inkjet method requires no photomask; thus, manufacturing cost can be reduced.

Next, as illustrated in FIG. 11B, a gate insulating film 714 is formed over the gate electrode 713. The gate insulating film 714 can be formed to have a single-layer structure or a stacked-layer structure using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film formed by a plasma CVD method, a sputtering method, or the like. It is preferable that the gate insulating film 714 contains as little impurities such as moisture or hydrogen as possible. In the case of forming a silicon oxide film by a sputtering method, a silicon target or a quartz target is used as a target, and oxygen or a mixed gas of oxygen and argon is used as a sputtering gas.

An oxide semiconductor in which impurities are reduced (a purified oxide semiconductor) is extremely sensitive to an interface state and interface charge; therefore, the interface between the purified oxide semiconductor and the gate insulating film 714 is important. Accordingly, the gate insulating film (GI) which is in contact with the purified oxide semiconductor needs to have high quality.

For example, a high-quality insulating film which is dense and has high withstand voltage can be formed by a high density plasma CVD method using microwaves (with a frequency of 2.45 GHz), which is preferable. This is because when the purified oxide semiconductor and the high-quality gate insulating film are disposed in close contact with each other, interface states can be reduced and interface characteristics can be made favorable.

Needless to say, other film formation methods, such as a sputtering method or a plasma CVD method, can be employed as long as a high-quality insulating film can be formed as the gate insulating film 714. A gate insulating film whose film quality is improved, or an insulating film whose characteristics of an interface with the oxide semiconductor are improved, by heat treatment after the formation may be used. In any case, any insulating film that has a reduced interface state density and can form a favorable interface between the gate insulating film and the oxide semiconductor as well as having favorable film quality as a gate insulating film can be used.

An example of an insulating film with which interface characteristics are improved is an insulating oxide film which includes oxygen in a portion in contact with the island-shaped oxide semiconductor film 715 formed later and from which part of oxygen is released by heating. For example, when the gate insulating film 714 is a silicon oxide film having higher oxygen content than that in the stoichiometric composition (SiOx where x>2), which is an example of the above-described insulating oxide film, oxygen can be supplied to the later formed oxide semiconductor film 715 by heat treatment, so that oxygen deficiency in the oxide semiconductor film 715 is reduced and the interface characteristics of the oxide semiconductor film 715 are improved, preventing a reduction in the resistances of the transistor 211 and the transistor 213.

The gate insulating film 714 may be formed to have a structure in which an insulating film formed using a material having a high barrier property and an insulating film having lower proportion of nitrogen, such as a silicon oxide film or a silicon oxynitride film, are stacked. In that case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a high barrier property can prevent impurities in an atmosphere, such as moisture or hydrogen, or impurities in the substrate, such as an alkali metal or a heavy metal, from entering the oxide semiconductor film, the gate insulating film 714, or the interface between the oxide semiconductor film and another insulating film and the vicinity thereof. In addition, the insulating film having a lower proportion of nitrogen, such as a silicon oxide film or a silicon oxynitride film, in contact with the oxide semiconductor film can prevent the insulating film having a high barrier property from being in direct contact with the oxide semiconductor film.

For example, the gate insulating film 714 may be formed in the following manner: a silicon nitride film ($SiN_y$ (y>0)) with a thickness of 50 nm or more and 200 nm or less is formed by a sputtering method as a first gate insulating film, and a silicon oxide film ($SiO_x$ (x>0)) with a thickness of 5 nm or more and 300 nm or less is stacked over the first gate insulating film as a second gate insulating film. The thickness of the gate insulating film 714 may be set as appropriate depending on characteristics needed for the transistor and may be about 100 nm to 500 nm.

Note that the gate insulating film 714 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, yttrium oxide, or lanthanum oxide, whereby gate leakage current can be reduced. Here, gate leakage current refers to leakage current which flows between a gate electrode and a source or drain electrode. A stack of a first gate insulating film formed of the high-k material and a second gate insulating film formed of silicon oxide, silicon oxynitride, silicon nitride, silicon nitride oxide, aluminum oxide, aluminum oxynitride, or gallium oxide may be used as the gate insulating film 714.

In this embodiment, the gate insulating film 714 is formed to have a structure in which a silicon oxide film having a thickness of 100 nm formed by a sputtering method is stacked over a silicon nitride film having a thickness of 50 nm formed by a sputtering method.

Note that the gate insulating film 714 is in contact with the oxide semiconductor to be formed later. When hydrogen is contained in the oxide semiconductor, characteristics of the transistor are adversely affected; therefore, it is preferable that the gate insulating film 714 do not contain hydrogen, a hydroxyl group, and moisture. In order that the gate insulating film 714 can contain as little hydrogen, hydroxyl group, and moisture as possible, it is preferable that an impurity adsorbed on the substrate 700, such as moisture or hydrogen, be eliminated and removed by preheating the substrate 700, over which the gate electrode 713 is formed, in a preheating chamber of a sputtering apparatus, as a pretreatment for film formation. The temperature for the preheating is in the range of 100° C. to 400° C., preferably 150° C. to 300° C. As an exhaustion unit provided in the preheating chamber, a cryopump is preferable. Note that this preheating treatment can be omitted.

Next, over the gate insulating film 714, an oxide semiconductor film having a thickness of 2 nm to 200 nm, preferably 3 nm to 50 nm, or more preferably 3 nm to 20 nm is formed. The oxide semiconductor film is formed by a sputtering method using an oxide semiconductor target. Moreover, the oxide semiconductor film can be formed by a sputtering method in a rare gas (e.g., argon) atmosphere, an oxygen atmosphere, or a mixed atmosphere of a rare gas (e.g., argon) and oxygen. An amorphous oxide semiconductor film or a crystalline oxide semiconductor film can be used as the oxide semiconductor film.

Note that before the oxide semiconductor film is formed by a sputtering method, reverse sputtering in which an argon gas is introduced and plasma is generated is preferably performed to remove dust from a surface of the gate insulating film 714. The reverse sputtering refers to a method in which, without application of voltage to a target side, an RF power source is used for application of voltage to a substrate side in an argon atmosphere to generate plasma in the vicinity of the substrate and modify a surface. Note that an atmosphere of nitrogen, helium, or the like may be used instead of an argon atmosphere. Alternatively, an argon atmosphere to which oxygen, nitrous oxide, or the like is added may be used. Alternatively, an argon atmosphere to which chlorine, carbon tetrafluoride, or the like is added may be used.

An oxide semiconductor to be used preferably contains at least indium (In) or zinc (Zn). In particular, In and Zn are preferably contained. As a stabilizer for reducing changes in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

Specifically, for the oxide semiconductor film, as described above, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Here, for example, an In—Ga—Zn-based oxide means an oxide containing In, Ga, and Zn, and there is no limitation on the composition ratio of In, Ga, and Zn. The In—Ga—Zn-based oxide may contain a metal element other than In, Ga, and Zn.

In this embodiment, as the oxide semiconductor film, an In—Ga—Zn-based oxide semiconductor thin film with a thickness of 30 nm, which is obtained by a sputtering method using a target including indium (In), gallium (Ga), and zinc (Zn), is used. In the case of forming an In—Ga—Zn-based oxide semiconductor film by a sputtering method, an In—Ga—Zn-based oxide semiconductor with an In:Ga:Zn atomic ratio of 1:1:1 (=1/3:1/3:1/3) or 2:2:1 (=2/5:2/5:1/5), or any oxide with a composition near to that of this oxide semiconductor can be used as a target.

When an oxide semiconductor film is formed using a target of an In—Ga—Zn-based oxide with the aforementioned atomic ratio, a polycrystal or a c-axis-aligned crystal (CAAC) is likely to be formed (the details will be described later). The filling rate of the target including In, Ga, and Zn is greater than or equal to 90% and less than or equal to 100%, preferably greater than or equal to 95% and less than 100%. With the use of the target having high filling rate, a dense oxide semiconductor film is formed.

When an In—Sn—Zn-based oxide semiconductor thin film formed by a sputtering method using a target containing In (indium), Sn (tin), and Zn (zinc) is used as the oxide semiconductor film, an In—Sn—Zn-based oxide semiconductor with an In:Sn:Zn atomic ratio of 1:1:1 (=1/3:1/3:1/3), 2:1:3 (=1/3:1/6:1/2), or 2:1:5 (=1/4:1/8:5/8), or any oxide with a composition near to that of this oxide semiconductor is preferably used as a target.

In the case where an In—Zn-based oxide material is used as an oxide semiconductor, a target therefor has an In:Zn atomic ratio of 50:1 to 1:2 (an In$_2$O$_3$:ZnO molar ratio of 25:1 to 1:4), preferably, an In:Zn atomic ratio of 20:1 to 1:1 (an In$_2$O$_3$:ZnO molar ratio of 10:1 to 1:2), further preferably, an In:Zn atomic ratio of 15:1 to 1.5:1 (an In$_2$O$_3$:ZnO molar ratio of 15:2 to 3:4). For example, in a target used for formation of an In—Zn-based oxide semiconductor which has an atomic ratio of In:Zn:O=X:Y:Z, the relation of Z>1.5X+Y is satisfied. The mobility can be improved by keeping the ratio of Zn within the above range.

In this embodiment, the oxide semiconductor film is formed over the substrate 700 in such a manner that the substrate is held in a treatment chamber kept at reduced pressure, a sputtering gas from which hydrogen and moisture are removed is introduced into the treatment chamber while residual moisture therein is removed, and the above target is used. The substrate temperature in film formation may be in the range of 100° C. to 600° C., preferably 200° C. to 400° C. By forming the oxide semiconductor film in a state where the substrate is heated, the concentration of impurities included in the formed oxide semiconductor film can be reduced. In addition, damage by sputtering can be reduced. In order to remove residual moisture in the treatment chamber, an entrapment vacuum pump is preferably used. For example, a cryopump, an ion pump, or a titanium sublimation pump is preferably used. The exhaustion unit may be a turbo pump provided with a cold trap. In the film formation chamber which is exhausted with a cryopump, for example, a hydrogen atom, a compound containing a hydrogen atom, such as water (H$_2$O), (preferably, also a compound containing a carbon atom), and the like are removed, whereby the concentration of an impurity contained in the oxide semiconductor film formed in the film formation chamber can be reduced.

As one example of the film formation conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

In order that the oxide semiconductor film can contain as little hydrogen, hydroxyl group, and moisture as possible, it is preferable that an impurity adsorbed on the substrate 700, such as moisture or hydrogen, be eliminated and removed by preheating the substrate 700 which has been subjected to the process up to and including the step of forming the gate insulating film 714, in a preheating chamber of a sputtering apparatus, as a pretreatment for film formation. The temperature for the preheating is in the range of 100° C. to 400° C., preferably 150° C. to 300° C. As an exhaustion unit provided in the preheating chamber, a cryopump is preferable. Note that this preheating treatment can be omitted. This preheating may be similarly performed on the substrate 700 which has been subjected to the process up to and including the step of forming conductive films 716 to 721, before the formation of an insulating film 722 which will be formed later.

Next, as illustrated in FIG. 11B, the oxide semiconductor film is processed (patterned) into a desired shape by etching or the like, whereby an island-shaped oxide semiconductor film 715 is formed over the gate insulating film 714 in a position where the island-shaped oxide semiconductor film 715 overlaps with the gate electrode 713.

A resist mask for forming the oxide semiconductor film 715 may be formed by an inkjet method. Formation of the resist mask by an inkjet method requires no photomask; thus, manufacturing cost can be reduced.

Note that etching for forming the oxide semiconductor film 715 may be wet etching, dry etching, or both dry etching and wet etching. As the etching gas for dry etching, a gas containing chlorine (a chlorine-based gas such as chlorine (Cl$_2$), boron trichloride (BCl$_3$), silicon tetrachloride (SiCl$_4$), or carbon tetrachloride (CCl$_4$)) is preferably used. Alternatively, a gas containing fluorine (a fluorine-based gas such as carbon tetrafluoride (CF$_4$), sulfur hexafluoride (SF$_6$), nitrogen trifluoride (NF$_3$), or trifluoromethane (CHF$_3$)), hydrogen bromide (HBr), oxygen (O$_2$), any of these gases to which a rare gas such as helium (He) or argon (Ar) is added, or the like can be used.

As the dry etching method, a parallel-plate reactive ion etching (RIE) method or an inductively coupled plasma (ICP) etching method can be used. In order to etch the film into a desired shape, etching conditions (e.g., the amount of electric power applied to a coiled electrode, the amount of electric power applied to an electrode on the substrate side, and the electrode temperature on the substrate side) need to be set as appropriate.

As an etchant for wet etching, ITO-07N (produced by KANTO CHEMICAL CO., INC.) may be used.

Note that it is preferable that reverse sputtering be performed before the formation of a conductive film in a subsequent step so that a resist residue or the like left over surfaces of the oxide semiconductor film 715 and the gate insulating film 714 is removed.

Note that, in some cases, the oxide semiconductor film formed by a sputtering method or the like includes a large amount of moisture or hydrogen as impurities. Moisture and hydrogen easily form a donor level and thus serve as impurities in the oxide semiconductor. Thus, in one embodiment of the present invention, in order to reduce an impurity such as moisture or hydrogen in the oxide semiconductor film, heat treatment is performed on the oxide semiconductor film 715 in a nitrogen atmosphere, an oxygen atmosphere, an atmosphere of ultra-dry air, or a rare gas (e.g., argon, helium) atmosphere. It is preferable that the water content in the gas be 20 ppm or less, preferably 1 ppm or less, further preferably 10 ppb or less.

By performing heat treatment on the oxide semiconductor film 715, moisture or hydrogen in the oxide semiconductor film 715 can be eliminated. Specifically, heat treatment may be performed at a temperature of 300° C. to 700° C., preferably 300° C. to 500° C. For example, heat treatment may be performed at 500° C. for approximately 3 to 6 minutes. When an RTA method is used for the heat treatment, dehydration or dehydrogenation can be performed in a short time; therefore, treatment can be performed even at a temperature higher than the strain point of a glass substrate. The concentration of hydrogen in the oxide semiconductor film is reduced in this manner, whereby the threshold voltage of the transistor can be prevented from shifting in the negative direction.

Oxygen deficiency is likely to be formed in an oxide semiconductor film formed by a sputtering method or the like. Part of oxygen deficiency contributes to carrier generation, thereby reducing the resistance of a transistor. Oxygen deficiency can be compensated by using an insulating oxide film as the gate insulating film 714 and performing heat treatment. By using an insulating oxide film from which part of oxygen is released by heating as the insulating oxide film as described above, more oxygen deficiency can be compensated. With these methods, a reduction in the resistances of the transistor 211 and the transistor 213 can be prevented.

Heat treatment for the oxide semiconductor film 715 may be performed before it is patterned.

In this embodiment, an electrical furnace that is one of heat treatment apparatuses is used.

Note that a heat treatment apparatus is not limited to an electrical furnace, and may include a device for heating a process object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

In the heat treatment, it is preferable that moisture, hydrogen, or the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, more preferably 7N (99.99999%) or more (i.e., the impurity concentration is 1 ppm or less, preferably 0.1 ppm or less).

Through the above-described process, the concentration of hydrogen in the oxide semiconductor film 715 can be reduced and the oxide semiconductor film 715 can be purified. Thus, the oxide semiconductor film can be stabilized. In addition, heat treatment at a temperature of lower than or equal to the glass transition temperature makes it possible to form an oxide semiconductor film with a wide band gap in which the density of carriers generated due to hydrogen is low. Therefore, the transistor can be manufactured using a large-sized substrate, so that the productivity can be increased. Note that it is preferable that heat treatment be performed such that the hydrogen concentration in the oxide semiconductor film 715 is $5 \times 10^{19}/cm^3$ or less or $5 \times 10^{18}/cm^3$ or less. Further, it is preferable that oxygen deficiency be compensated such that the oxide semiconductor film 715 has higher oxygen content than that in the stoichiometric composition.

Completed transistors (the transistors 211 and 213) including the oxide semiconductor film 715 in which the hydrogen concentration is reduced to the above-described value can have an off-state current of 10 aA ($1 \times 10^{-17}$ A) or less, 1 aA ($1 \times 10^{-18}$ A) or less, 1 zA ($1 \times 10^{-21}$ A) or less, or 1 yA ($1 \times 10^{-24}$ A) or less per micrometer of channel width at room temperature. Therefore, the completed transistors (the transistors 211 and 213) have extremely low off-state current density, so that the solid-state imaging device according to one embodiment of the present invention can be manufactured.

Note that in the case where the oxide semiconductor film is heated, although depending on a material of the oxide semiconductor film or heating conditions, plate-like crystals are formed at the surface of the oxide semiconductor film in some cases. The plate-like crystal is preferably a single crystal which is c-axis-aligned in a direction substantially perpendicular to a surface of the oxide semiconductor film. Even if the plate-like crystals do not form a single crystal body, each crystal is preferably a polycrystalline body which is c-axis-aligned in a direction substantially perpendicular to the surface of the oxide semiconductor film. In the above-described polycrystalline body, in addition to being c-axis-aligned, the crystals preferably have identical a-b planes, a-axes, or b-axes. Note that when a base surface of the oxide semiconductor film is uneven, a plane-like crystal is a polycrystalline body. Therefore, the surface of the base is preferably as even as possible. Specifically, the surface of the base preferably has an average surface roughness (Ra) of 1 nm or less, preferably 0.3 nm or less. In this specification, an oxide semiconductor film including a plate-like crystal is referred to as c-axis aligned crystalline oxide semiconductor (CAAC-OS).

There are three methods for forming a CAAC-OS film.

The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

For example, it is desirable that the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

With use of the CAAC-OS film in a transistor, change in electric characteristics of the transistor due to irradiation with visible light or ultraviolet light can be reduced. Thus, the transistor has high reliability.

Next, the insulating film 708, the insulating film 712, and the gate insulating film 714 are partly etched, whereby contact holes reaching the island-shaped semiconductor film 702, the island-shaped semiconductor film 703, and the wiring 711 are formed.

Then, a conductive film is formed so as to cover the oxide semiconductor film 715 by a sputtering method or a vacuum evaporation method. After that, the conductive film is patterned by etching or the like, so that the conductive films 716 to 721 which each function as a source electrode, a drain electrode, or a wiring are formed as illustrated in FIG. 11C.

Note that the conductive films 716 and 717 are in contact with the island-shaped semiconductor film 702. The conductive film 717 is connected to the conductive film 720, which is not illustrated in FIG. 11C. The conductive films 718 and 719 are in contact with the island-shaped semiconductor film 703. The conductive film 720 is in contact with the wiring 711 and the oxide semiconductor film 715. The conductive film 721 is in contact with the oxide semiconductor film 715.

As a material of the conductive film for forming the conductive films 716 to 721, any of the following materials can be used: an element selected from aluminum, chromium, copper, tantalum, titanium, molybdenum, or tungsten; an alloy including any of these elements; an alloy film including the above elements in combination; or the like. Alternatively, a structure may be employed in which a film of a refractory metal such as chromium, tantalum, titanium, molybdenum, or tungsten is stacked over or under a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film may have a single-layer structure or a stacked-layer structure including two or more layers. For example, a single-layer structure of an aluminum film containing silicon; a two-layer structure including a titanium film over an aluminum film; a three-layer structure in which a titanium film, an aluminum film, and a titanium film are stacked in this order; and the like can be given.

The conductive film for forming the conductive films 716 to 721 may be formed using a conductive metal oxide. As the conductive metal oxide, indium oxide, tin oxide, zinc oxide, a mixture of indium oxide and tin oxide, a mixture of indium oxide and zinc oxide, or a mixture of the metal oxide materials containing silicon or silicon oxide can be used.

In the case where heat treatment is performed after formation of the conductive film, the conductive film preferably has heat resistance sufficient to withstand the heat treatment.

Note that the material and etching conditions are adjusted as appropriate so that the oxide semiconductor film 715 is not removed in etching of the conductive film as much as possible. Depending on the etching conditions, there are some cases in which an exposed portion of the oxide semiconductor film 715 is partly etched and thus a groove (a depression portion) is formed.

In this embodiment, a titanium film is used as the conductive film. Therefore, the conductive film can be selectively etched by wet etching by using a solution (an ammonia hydrogen peroxide mixture) containing ammonia and hydrogen peroxide water; however, the oxide semiconductor film 715 is also partly etched in some cases. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, the conductive film may be etched by dry etching by using a gas containing chlorine ($Cl_2$), boron trichloride ($BCl_3$), or the like.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can also be reduced, whereby simplification of the process can be realized.

Next, plasma treatment is performed using a gas such as $N_2O$, $N_2$, or Ar. By this plasma treatment, water or the like adhering to an exposed surface of the oxide semiconductor film is removed. Plasma treatment may be performed using a mixture gas of oxygen and argon as well.

After the plasma treatment, as illustrated in FIG. 11C, the insulating film 722 is formed so as to cover the conductive films 716 to 721 and the oxide semiconductor film 715. The insulating film 722 preferably contains as little impurities such as moisture, and hydrogen, as possible. An insulating film of a single layer or a plurality of insulating films stacked may be employed as the insulating film 722. When hydrogen is contained in the insulating film 722, entry of the hydrogen into the oxide semiconductor film or extraction of oxygen from the oxide semiconductor film by the hydrogen occurs, whereby a back channel portion of the oxide semiconductor film has lower resistance (n-type conductivity); thus, a parasitic channel might be formed. Therefore, it is important that a film formation method in which hydrogen is not used be employed in order to form the insulating film 722 containing as little hydrogen as possible. A material that can be used for the gate insulating film 714 can be used for the insulating film 722 and a material having a high barrier property is preferably used for the insulating film 722. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having a lower proportion of nitrogen such as a silicon oxide film or a silicon oxynitride film is formed on the side closer to the oxide semiconductor film 715 than the insulating film having a high barrier property. Then, the insulating film having a high barrier property is formed so as to overlap with the conductive films 716 to 721 and the oxide semiconductor film 715 with the insulating film having a lower proportion of nitrogen sandwiched therebetween. When the insulating film having a high barrier property is used, impurities such as moisture or hydrogen can be prevented from entering the oxide semiconductor film 715, the gate insulating film 714, or the interface between the oxide semiconductor film 715 and another insulating film and the vicinity thereof. In addition, the insulating film having a lower proportion of nitrogen such as a silicon oxide film or a silicon oxynitride film formed in contact with the oxide semiconductor film 715 can prevent the insulating film formed using a material having a high barrier property from being in direct contact with the oxide semiconductor film 715.

In this embodiment, the insulating film 722 is formed to have a structure in which a silicon nitride film having a thickness of 100 nm formed by a sputtering method is stacked over a silicon oxide film having a thickness of 200 nm formed by a sputtering method. The substrate temperature in film formation may be higher than or equal to room temperature and lower than or equal to 300° C., and is 100° C. in this embodiment.

After the insulating film 722 is formed, heat treatment may be performed. The heat treatment is performed in a nitrogen atmosphere, an atmosphere of ultra-dry air, or a rare gas (e.g., argon, helium) atmosphere preferably at a temperature in the range of 200° C. to 400° C., for example, 250° C. to 350° C. It is preferable that the water content in the gas be 20 ppm or less, preferably 1 ppm or less, further preferably 10 ppb or less. In this embodiment, for example, heat treatment is performed at 250° C. in a nitrogen atmosphere for 1 hour. Furthermore, RTA treatment for a short time at a high temperature may be performed before the formation of the conductive films 716 to 721 in a manner similar to that of the previous heat treatment performed on the oxide semiconductor film to reduce moisture or hydrogen. Even when oxygen defects are generated in the oxide semiconductor film 715 by the previous heat treatment performed on the oxide semiconductor film by performing heat treatment after providing the insulating film 722 containing oxygen, oxygen is supplied to the oxide semiconductor film 715 from the insulating film 722. By supplying oxygen to the oxide semiconductor film 715, oxygen defects that serve as donors can be reduced in the oxide semiconductor film 715 and the stoichiometric composition can be satisfied. It is preferable that the proportion of oxygen in the oxide semiconductor film 715 be higher than that in the stoichiometric composition. As a result, the oxide semiconductor film 715 can be made to be substantially i-type and variation in electrical characteristics of the transistor due to oxygen defects can be reduced; thus, electrical characteristics can be improved. The timing of this heat treatment is not particularly limited as long as it is after the formation of the insulating film 722. When this heat treatment doubles as another step such as heat treatment for formation of a resin film or heat treatment for reduction of the resistance of a transparent conductive film, the oxide semiconductor film 715 can be highly purified without the number of steps increased.

Moreover, the oxygen defects that serve as donors in the oxide semiconductor film 715 may be reduced by subjecting the oxide semiconductor film 715 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor film 715 by an ion implantation method, an ion doping method, or the like to reduce oxygen defects serving as donors. For example, oxygen which is made into a plasma state with a microwave at 2.45 GHz may be added to the oxide semiconductor film 715.

Note that a back gate electrode may be formed in a position overlapping with the oxide semiconductor film 715 by forming a conductive film over the insulating film 722 and then patterning the conductive film. In the case where the back gate electrode is formed, an insulating film is preferably formed to cover the back gate electrode. The back gate electrode can be formed using a material and a structure similar to those of the gate electrode 713 or the conductive films 716 to 721.

The thickness of the back gate electrode is in the range of 10 nm to 400 nm, preferably 100 nm to 200 nm. For example, the back gate electrode may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) into a desired shape.

Through the above-described process, the transistor 211 and the transistor 213 are formed.

The transistor 211 and the transistor 213 each include the gate electrode 713, the gate insulating film 714 over the gate electrode 713, the oxide semiconductor film 715 which is over the gate insulating film 714 and overlaps with the gate electrode 713, and a pair of the conductive films 720 and 721 formed over the oxide semiconductor film 715. Further, the transistor 211 and the transistor 213 may each include the insulating film 722 as its component. The transistor 211 and the transistor 213 illustrated in FIG. 11C are channel-etched type transistors in which part of the oxide semiconductor film 715 between the conductive film 720 and the conductive film 721 is etched.

Although the transistor 211 and the transistor 213 is described as a single-gate transistor, a multi-gate transistor including a plurality of channel formation regions can be manufactured when a plurality of gate electrodes 713 electrically connected to each other is included, if needed. Although the transistor 211 and the transistor 213 are inverted staggered bottom-gate transistors, the structure of the transistors is not limited to these. For example, they may alternatively be channel protective (channel-stop) inverted staggered bottom-gate transistors, staggered top-gate transistors, or coplanar top-gate transistors like the transistor 215.

In order that the transistor 211 and the transistor 213 can be coplanar top-gate transistors, it is preferable that the gate electrode be used as a mask and a dopant be added to the oxide semiconductor film to form a source region and a drain region in the oxide semiconductor film in a self-aligned manner. This is effective in suppressing shift of the threshold voltage in the negative direction due to miniaturization of the transistor. The dopant may be added by an ion implantation method or an ion doping method. Alternatively, the dopant may be added by performing plasma treatment in an atmosphere of a gas containing the dopant. As the added dopant, nitrogen, phosphorus, boron, or the like is used. Note that also in the transistor 215, a source region and a drain region may be formed in a self-aligned manner after addition of a dopant.

This embodiment can be implemented in appropriate combination with any of the structures described in the other embodiments.

Embodiment 4

The solid-state imaging device described in the above embodiments can be used in electronic devices such as display devices, mobile phones, portable game machines, portable information terminals, electronic book devices, video cameras, and digital still cameras. Specific examples of electronic devices using the solid-state imaging device described in the above embodiments are illustrated in FIGS. 12A to 12D.

Figure 12A:
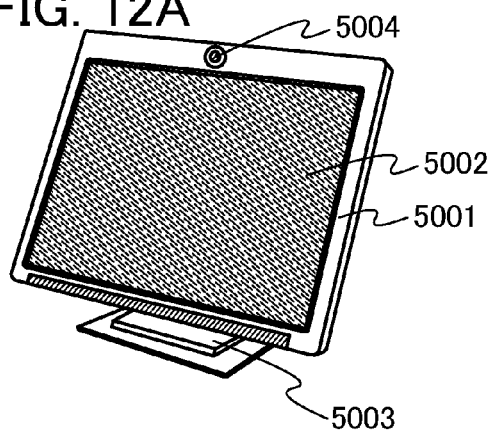
FIGS. 12A to 12D are diagrams illustrating electronic devices.

FIG. 12A illustrates a display device including a housing 5001, a display portion 5002, a supporting base 5003, an imaging portion 5004, and the like. The solid-state imaging device described in the above embodiments can be used for the imaging portion 5004. The use of the solid-state imaging device described in the above embodiments for the imaging portion 5004 can provide a display device that enables obtainment of high-quality image data and obtainment of high-resolution images. Note that the display device includes all devices for displaying information such as for a personal computer, for receiving TV broadcasting, and for displaying an advertisement.

Figure 12B:
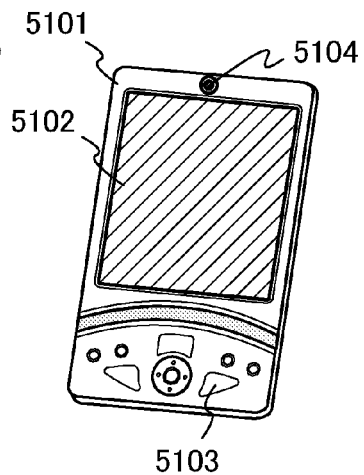

FIG. 12B illustrates a portable information terminal including a housing 5101, a display portion 5102, operation keys 5103, an imaging portion 5104, and the like. The solid-state imaging device described in the above embodiments can be used for the imaging portion 5104. The use of the solid-state imaging device described in the above embodiments for the imaging portion 5104 can provide a portable information terminal that enables obtainment of high-quality image data and obtainment of high-resolution images.

Figure 12C:
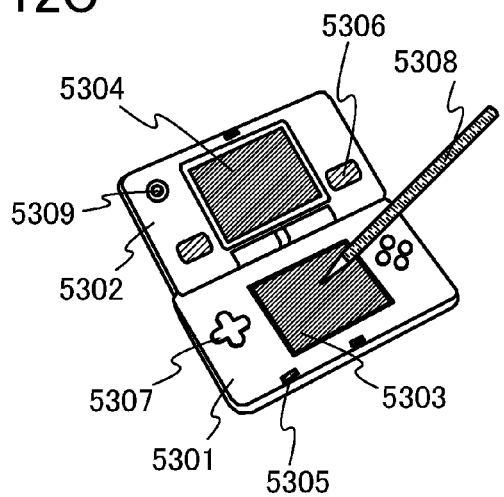

FIG. 12C illustrates a portable game machine including a housing 5301, a housing 5302, a display portion 5303, a display portion 5304, a microphone 5305, a speaker 5306, an operation key 5307, a stylus 5308, an imaging portion 5309, and the like. The solid-state imaging device described in the above embodiments can be used for the imaging portion 5309. The use of the solid-state imaging device described in the above embodiments for the imaging portion 5309 can provide a portable game machine that enables obtainment of high-quality image data and obtainment of high-resolution images. Note that although the portable game machine illustrated in FIG. 12C includes the two display portions 5303 and 5304, the number of display portions included in the portable game machine is not limited to two.

Figure 12D:
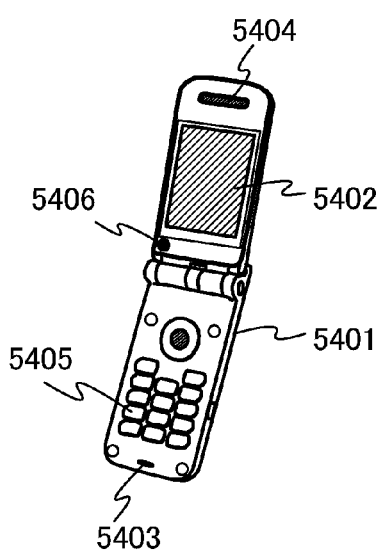

FIG. 12D illustrates a mobile phone including a housing 5401, a display portion 5402, an audio input portion 5403, an audio output portion 5404, operation keys 5405, an imaging portion 5406, and the like. The solid-state imaging device described in the above embodiments can be used for the imaging portion 5406. The use of solid-state imaging device described in the above embodiments for the imaging portion 5406 can provide a mobile phone that enables obtainment of high-quality image data and obtainment of high-resolution images.

REFERENCE NUMERALS

100: solid-state imaging device, 101: pixel portion, 103: horizontal selection circuit, 105: data output circuit, 107: data processing circuit, 109: selection line, 111: output line, 113: pixel, 201: switching element, 202: sub-pixel, 203: sub-pixel, 205: photosensor, 206: photosensor, 207: photodiode, 209: amplifier circuit, 211: transistor, 213: transistor, 215: transistor, 217: transistor, 300: reset period, 301: exposure period, 302: readout period, 700: substrate, 701: insulating film, 702: semiconductor film, 703: semiconductor film, 707: gate electrode, 708: insulating film, 711: wiring, 712: insulating film, 713: gate electrode, 714: gate insulating film, 715: oxide semiconductor film, 722: insulating film, 727: region, 728: region, 729: region, 5001: housing, 5002: display portion, 5003: supporting base, 5004: imaging portion, 5101: housing, 5102: display portion, 5103: operation key, 5104: imaging portion, 5301: housing, 5302: housing, 5303: display portion, 5304: display portion, 5305: microphone, 5306: speaker, 5307: operation key, 5308: stylus, 5309: imaging portion, 5401:

housing, 5402: display portion, 5403: audio input portion, 5404: audio output portion, 5405: operation key, 5406: imaging portion This application is based on Japanese Patent Application serial no. 2011-156679 filed with Japan Patent Office on Jul. 15, 2011, the entire contents of which are hereby incorporated by reference.

The invention claimed is:

1. A semiconductor device comprising:
a first photodiode;
a second photodiode;
a first transistor;
a second transistor;
a third transistor; and
an output line,
wherein an electrode of the first photodiode is directly connected to one of a source and a drain of the first transistor,
wherein the other of the source and the drain of the first transistor is electrically connected to the output line,
wherein an electrode of the second photodiode is directly connected to one of a source and a drain of the second transistor,
wherein the other of the source and the drain of the second transistor is electrically connected to the output line,
wherein one of a source and a drain of the third transistor is directly connected to the electrode of the first photodiode, and
wherein the other of the source and the drain of the third transistor is directly connected to the electrode of the second photodiode.

2. The semiconductor device according to claim 1, wherein the off-state current density of the third transistor is 100 yA/μm or less.

3. The semiconductor device according to claim 1, wherein the third transistor comprises, in a channel formation region, a semiconductor material having a wider band gap than silicon and a lower intrinsic carrier density than silicon.

4. The semiconductor device according to claim 3, wherein the semiconductor material is an oxide semiconductor.

5. A semiconductor device comprising:
a first photodiode;
a second photodiode;
a first transistor;
a second transistor;
a third transistor;
a fourth transistor;
a fifth transistor; and
an output line,
wherein an electrode of the first photodiode is directly connected to one of a source and a drain of the first transistor,
wherein the other of the source and the drain of the first transistor is electrically connected to a gate of the fourth transistor, so that the electrode of the first photodiode is electrically connected to the gate of the fourth transistor via the first transistor, and
wherein an electrode of the second photodiode is directly connected to one of a source and a drain of the second transistor,
wherein the other of the source and the drain of the second transistor is electrically connected to a gate of the fifth transistor, so that the electrode of the second photodiode is electrically connected to the gate of the fifth transistor via the second transistor,
wherein one of a source and a drain of the fourth transistor is electrically connected to the output line,
wherein one of a source and a drain of the fifth transistor is electrically connected to the output line,
wherein one of a source and a drain of the third transistor is directly connected to the electrode of the first photodiode, and
wherein the other of the source and the drain of the third transistor is directly connected to the electrode of the second photodiode.

6. The semiconductor device according to claim 5, further comprising a sixth transistor and a seventh transistor,
wherein one of a source and a drain of the sixth transistor is electrically connected to the one of the source and the drain of the fourth transistor and the other of the source and the drain of the sixth transistor is electrically connected to the output line, so that the one of the source and the drain of the fourth transistor is electrically connected to the output line via the sixth transistor, and
wherein one of a source and a drain of the seventh transistor is electrically connected to the one of the source and the drain of the fifth transistor and the other of the source and the drain of the seventh transistor is electrically connected to the output line, so that the one of the source and the drain of the fifth transistor is electrically connected to the output line via the seventh transistor.

7. The semiconductor device according to claim 5, wherein the off-state current density of the third transistor is 100 yA/μm or less.

8. The semiconductor device according to claim 5, wherein the third transistor comprises, in a channel formation region, a semiconductor material having a wider band gap than silicon and a lower intrinsic carrier density than silicon.

9. The semiconductor device according to claim 8, wherein the semiconductor material is an oxide semiconductor.

10. A method of driving a semiconductor device comprising a first photodiode, a second photodiode, a first transistor, a second transistor, a third transistor, and an output line, wherein an electrode of the first photodiode is directly connected to one of a source and a drain of the first transistor, wherein the other of the source and the drain of the first transistor is electrically connected to the output line, wherein an electrode of the second photodiode is directly connected to one of a source and a drain of the second transistor, wherein the other of the source and the drain of the second transistor is electrically connected to the output line, wherein one of a source and a drain of the third transistor is directly connected to the electrode of the first photodiode, and wherein the other of the source and the drain of the third transistor is directly connected to the electrode of the second photodiode, the method comprising the step of:
selecting an on state and an off state of the third transistor in accordance with a luminance of external light.

11. The semiconductor device according to claim 10, wherein the off-state current density of the third transistor is 100 yA/μm or less.

12. The semiconductor device according to claim 10, wherein the third transistor comprises, in a channel formation region, a semiconductor material having a wider band gap than silicon and a lower intrinsic carrier density than silicon.

13. The semiconductor device according to claim 12, wherein the semiconductor material is an oxide semiconductor.

* * * * *